United States Patent
Enomoto et al.

(10) Patent No.: US 11,803,124 B2
(45) Date of Patent: Oct. 31, 2023

(54) PLANOGRAPHIC PRINTING PLATE PRECURSOR, METHOD OF PREPARING PLANOGRAPHIC PRINTING PLATE, AND PLANOGRAPHIC PRINTING METHOD

(71) Applicant: FUJIFILM Corporation, Tokyo (JP)

(72) Inventors: Kazuaki Enomoto, Shizuoka (JP); Kenjiro Araki, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 17/385,435

(22) Filed: Jul. 26, 2021

(65) Prior Publication Data

US 2021/0356866 A1 Nov. 18, 2021

Related U.S. Application Data

(63) Continuation of application No. PCT/JP2019/051256, filed on Dec. 26, 2019.

(30) Foreign Application Priority Data

Jan. 31, 2019 (JP) ................. 2019-016541

(51) Int. Cl.

| | | |
|---|---|---|
| G03F 7/038 | (2006.01) | |
| B41C 1/10 | (2006.01) | |
| B41M 1/06 | (2006.01) | |
| G03F 7/11 | (2006.01) | |
| B41N 1/14 | (2006.01) | |
| C08F 220/60 | (2006.01) | |
| B41F 23/02 | (2006.01) | |
| C08F 212/08 | (2006.01) | |
| C08F 220/06 | (2006.01) | |
| C08F 220/44 | (2006.01) | |

(52) U.S. Cl.
CPC ............ *G03F 7/038* (2013.01); *B41C 1/1008* (2013.01); *B41F 23/02* (2013.01); *B41M 1/06* (2013.01); *C08F 212/08* (2013.01); *C08F 220/06* (2013.01); *C08F 220/44* (2013.01); *C08F 220/603* (2020.02); *G03F 7/11* (2013.01); *B41C 2201/02* (2013.01); *B41C 2210/04* (2013.01); *B41C 2210/08* (2013.01); *B41C 2210/24* (2013.01); *B41N 1/14* (2013.01)

(58) Field of Classification Search
CPC ................................................ B41C 2210/08
See application file for complete search history.

(56) References Cited

U.S. PATENT DOCUMENTS

| | | | |
|---|---|---|---|
| 2009/0056581 A1 | 3/2009 | Yu | |
| 2010/0316850 A1 | 12/2010 | Tao et al. | |
| 2013/0029268 A1 | 1/2013 | Koyama et al. | |
| 2018/0361774 A1 | 12/2018 | Aizu et al. | |
| 2020/0094542 A1* | 3/2020 | Hirano | C08F 2/44 |

FOREIGN PATENT DOCUMENTS

| | | | |
|---|---|---|---|
| CN | 102804067 A | 11/2012 | |
| EP | 0859284 A1 | 8/1998 | |
| EP | 1 975 709 A1 | 10/2008 | |
| EP | 2440977 A1 | 4/2012 | |
| JP | 2006-315265 A | 11/2006 | |
| JP | 2008-256742 A | 10/2008 | |
| JP | 2009-139739 A | 6/2009 | |
| JP | 2010-234589 A | 10/2010 | |
| JP | 2013-047782 A | 3/2013 | |
| JP | 2019-018412 A | 2/2019 | |
| WO | 2010/144119 A1 | 12/2010 | |
| WO | 2017/150039 A1 | 9/2017 | |
| WO | WO-2018221133 A1 * | 12/2018 | ........... B41C 1/1008 |
| WO | 2019/013139 A1 | 1/2019 | |

OTHER PUBLICATIONS

Extended European Search Report dated Feb. 9, 2022 from the European Patent Office in EP Application No. 19913153.3.
Notice of Reasons for Refusal dated Feb. 15, 2022 from the Japanese Patent Office in JP Application No. 2020-569458.
International Search Report dated Mar. 10, 2020 in International Application No. PCT/JP2019/051256.
Written Opinion of the International Searching Authority dated Mar. 10, 2020 in International Application No. PCT/JP2019/051256.
International Preliminary Report on Patentability dated Jul. 27, 2021 in International Application No. PCT/JP2019/051256.
Office Action dated Aug. 1, 2022 from the China National Intellectual Property Administration in CN Application No. 201980091004.6.
Chinese Office Action dated Apr. 13, 2023 from China National Intellectual Property Office in Chinese Application No. 201980091004.6.

* cited by examiner

*Primary Examiner* — Joshua D Zimmerman
(74) *Attorney, Agent, or Firm* — Sughrue Mion, PLLC

(57) ABSTRACT

Provided are a planographic printing plate precursor including a support and an image recording layer on the support, in which the image recording layer contains an organic particle containing a resin that has a constitutional unit A having a cation moiety and a constitutional unit B having an anion moiety; and a method of preparing a planographic printing plate using the planographic printing plate precursor.

19 Claims, No Drawings

PLANOGRAPHIC PRINTING PLATE PRECURSOR, METHOD OF PREPARING PLANOGRAPHIC PRINTING PLATE, AND PLANOGRAPHIC PRINTING METHOD

CROSS-REFERENCE TO RELATED APPLICATION

This application is a continuation application of International Application No. PCT/JP2019/051256, filed Dec. 26, 2019, the disclosure of which is incorporated herein by reference in its entirety. Further, this application claims priority from Japanese Patent Application No. 2019-016541, filed Jan. 31, 2019, the disclosure of which is incorporated herein by reference in its entirety.

BACKGROUND OF THE INVENTION

1. Field of the Invention

The present disclosure relates to a planographic printing plate precursor, a method of preparing a planographic printing plate, and a planographic printing method.

2. Description of the Related Art

A planographic printing plate is typically formed of a lipophilic image area that receives ink in the process of printing and a hydrophilic non-image area that receives dampening water. Planographic printing is a method of performing printing by utilizing the property that water and oil-based ink repel each other to generate a difference in adhesiveness of ink onto a surface of a planographic printing plate using a lipophilic image area of the planographic printing plate as an ink receiving unit and a hydrophilic non-image area as a dampening water receiving unit (ink non-receiving unit), allowing the ink to land only on an image area, and transferring the ink to a printing material such as paper.

In the related art, a planographic printing plate precursor (PS plate) obtained by providing a lipophilic photosensitive resin layer (image recording layer) on a hydrophilic support has been widely used in order to prepare such a planographic printing plate. A planographic printing plate is typically obtained by performing plate-making according to a method of exposing a planographic printing plate precursor through an original picture such as a lith film, allowing a part which is an image area of an image recording layer to remain, dissolving the other unnecessary part of the image recording layer in an alkaline developer or an organic solvent so that the part is removed, and exposing a surface of a hydrophilic support to form a non-image area.

Further, environmental problems related to a waste liquid associated with wet treatments such as a development treatment have been highlighted due to the growing interest in the global environment.

In order to deal with the above-described environmental problem, it is desired to simplify the process of development or plate-making or not to perform any treatment. As one of simple preparation methods, a method referred to as "on-press development" has been performed. That is, the on-press development is a method of exposing a planographic printing plate precursor, mounting the planographic printing plate precursor on a printing press without performing development of the related art, and removing an unnecessary part of an image recording layer, at an initial stage of a typical printing step.

Examples of planographic printing plate precursors of the related art include those described in WO2017/150039A and JP2006-315265A.

WO2017/150039A discloses a planographic printing plate precursor including a support; and an image recording layer on the support, in which the image recording layer contains an infrared absorbing agent, a polymerization initiator, a polymerizable compound containing a hydrogen-bonding group, and a hard polymer particle having on the surface thereof at least one group selected from the group consisting of a urethane group, and a urea group, an imide group, an amide group, and a sulfonamide group, and the number average primary particle diameter of the hard polymer particle is in a range of 0.01 to 1 µm.

JP2006-315265A discloses a printing plate material having a hydrophilic layer and an image forming layer on a base material, in which the hydrophilic layer contains (A) particles having a particle diameter of 1 to 10 µm and a new Mohs hardness of 11 to 15 and (B) particles having a particle diameter of 10 nm to 1 µm and a true specific gravity that is larger than that of (A) particles.

SUMMARY OF THE INVENTION

An object to be achieved by an aspect of the present disclosure is to provide a planographic printing plate precursor with excellent printing durability even in a case where UV ink is used.

An object to be achieved by another aspect of the present disclosure is to provide a method of preparing a planographic printing plate using the planographic printing plate precursor and a planographic printing method using the planographic printing plate precursor.

The means for achieving the above-described object includes the following aspects.

<1> A planographic printing plate precursor comprising: a support; and an image recording layer on the support, in which the image recording layer contains an organic particle containing a resin that has a constitutional unit A having a cation moiety and a constitutional unit B having an anion moiety.

<2> The planographic printing plate precursor according to <1>, in which a total content of the constitutional unit A and the constitutional unit B in the resin contained in the organic particle is greater than 5% by mass with respect to a total mass of the resin.

<3> The planographic printing plate precursor according to <1> or <2>, in which the constitutional unit B contains at least one group selected from the group consisting of a carboxylic acid group, a phenolic hydroxyl group, a sulfonic acid group, a phosphoric acid group, and an imide group.

<4> The planographic printing plate precursor according to any one of <1> to <3>, in which the cation moiety is a group having a nitrogen atom.

<5> The planographic printing plate precursor according to any one of <1> to <4>, in which the resin contained in the organic particle includes an addition polymerization type resin.

<6> The planographic printing plate precursor according to any one of <1> to <5>, in which the total content of the constitutional unit A and the constitutional unit B in the resin is greater than 20% by mass with respect to the total mass of the resin, and a content of the constitutional unit A is 10% by mass or greater with respect to the total content of the resin.

<7> The planographic printing plate precursor according to any one of <1> to <6>, in which the resin further has a constitutional unit containing a hydrophilic group.

<8> The planographic printing plate precursor according to <7>, in which the hydrophilic structure contains a group represented by Formula Z.

$$-Q-W-Y \qquad \text{Formula Z}$$

In Formula Z, Q represents a divalent linking group, W represents a divalent group having a hydrophilic structure or a divalent group having a hydrophobic structure, and Y represents a monovalent group having a hydrophilic structure or a monovalent group having a hydrophobic structure, where any of W and Y has a hydrophilic structure.

<9> The planographic printing plate precursor according to <7>, in which the hydrophilic group includes a group having a polyalkylene oxide structure.

<10> The planographic printing plate precursor according to <7>, in which the hydrophilic group includes a sulfonate group or a sulfonic acid group.

<11> The planographic printing plate precursor according to any one of <7> to <10>, in which a content of the constitutional unit containing the hydrophilic group in the resin is 1% by mass or greater and less than 20% by mass with respect to the total mass of the resin.

<12> The planographic printing plate precursor according to any one of <1> to <11>, in which the organic particle include an organic particle having an ethylenically unsaturated group on the surface thereof.

<13> The planographic printing plate precursor according to any one of <1> to <12>, in which the image recording layer further contains an infrared absorbing agent.

<14> The planographic printing plate precursor according to any one of <1> to <13>, in which the image recording layer further contains a polymerization initiator and a polymerizable compound.

<15> The planographic printing plate precursor according to any one of <1> to <14>, in which the image recording layer further contains a binder polymer.

<16> The planographic printing plate precursor according to any one of <1> to <15>, further comprising: a protective layer on the image recording layer.

<17> The planographic printing plate precursor according to <16>, in which the protective layer contains an inorganic layered compound.

<18> The planographic printing plate precursor according to any one of <1> to <17>, in which the image recording layer is a negative type image recording layer.

<19> The planographic printing plate precursor according to any one of <1> to <18>, in which the image recording layer is an on-press development type image recording layer.

<20> A method of preparing a planographic printing plate comprising: a step of imagewise-exposing the planographic printing plate precursor according to any one of <1> to <19>; and a step of supplying at least one selected from the group consisting of printing ink and dampening water to remove an image recording layer of a non-image area on a printing press.

<21> A planographic printing method comprising: a step of imagewise-exposing the planographic printing plate precursor according to any one of <1> to <19>; a step of supplying at least one selected from the group consisting of printing ink and dampening water to remove an image recording layer of a non-image area on a printing press and preparing a planographic printing plate; and a step of performing printing using the obtained planographic printing plate.

According to an aspect of the present disclosure, it is possible to provide a planographic printing plate precursor with excellent printing durability even in a case where UV ink is used.

Further, according to another aspect of the present disclosure, it is possible to provide a method of preparing a planographic printing plate using the planographic printing plate precursor and a planographic printing method using the planographic printing plate precursor.

DESCRIPTION OF THE PREFERRED EMBODIMENTS

Hereinafter, the contents of the present disclosure will be described in detail. The description of constituent elements below is made based on representative embodiments of the present disclosure in some cases, but the present disclosure is not limited to such embodiments.

Further, in the present specification, a numerical range shown using "to" indicates a range including numerical values described before and after "to" as a lower limit and an upper limit.

Further, in a case where substitution or unsubstitution is not noted in regard to the notation of a "group" (atomic group) in the present specification, the "group" includes not only a group that does not have a substituent but also a group having a substituent. For example, the concept of an "alkyl group" includes not only an alkyl group that does not have a substituent (unsubstituted alkyl group) but also an alkyl group having a substituent (substituted alkyl group).

In the present specification, the concept of "(meth)acryl" includes both acryl and methacryl, and the concept of "(meth)acryloyl" includes both acryloyl and methacryloyl.

Further, the term "step" in the present specification indicates not only an independent step but also a step which cannot be clearly distinguished from other steps as long as the intended purpose of the step is achieved. Further, in the present disclosure, "% by mass" has the same definition as that for "% by weight", and "part by mass" has the same definition as that for "part by weight".

Further, in the present disclosure, a combination of two or more preferred embodiments is a more preferred embodiment.

Further, the weight-average molecular weight (Mw) and the number average molecular weight (Mn) in the present disclosure are molecular weights in terms of polystyrene used as a standard substance, which are detected by using tetrahydrofuran (THF) as a solvent, a differential refractometer, and a gel permeation chromatography (GPC) analyzer using TSKgel GMHxL, TSKgel G4000HxL, and TSKgel G2000HxL (all trade names, manufactured by Tosoh Corporation) as columns, unless otherwise specified.

In the present specification, the term "planographic printing plate precursor" includes not only a planographic printing plate precursor but also a key plate precursor. Further, the term "planographic printing plate" includes not only a planographic printing plate prepared by performing operations such as exposure and development on a planographic printing plate precursor as necessary but also a key plate. In a case of a key plate precursor, the operations of exposure, development, and the like are not necessarily required. Further, a key plate is a planographic printing plate precursor for attachment to a plate cylinder that is not used in a case where printing is performed on a part of a paper surface with one or two colors in color newspaper printing.

Hereinafter, the present disclosure will be described in detail.

(Planographic Printing Plate Precursor)

A planographic printing plate precursor according to the embodiment of the present disclosure is a planographic printing plate precursor including a support and an image recording layer on the support, in which the image recording layer contains an organic particle containing a resin that has a constitutional unit A having a cation moiety and a constitutional unit B having an anion moiety.

Further, the planographic printing plate precursor according to the embodiment of the present disclosure may be a negative type planographic printing plate precursor or a positive type planographic printing plate precursor, but it is preferable that the planographic printing plate precursor is a negative type planographic printing plate precursor.

Further, the planographic printing plate precursor according to the embodiment of the present disclosure can be suitably used as a planographic printing plate precursor for on-press development.

In the planographic printing plate, a planographic printing plate in which the number of printable plates (hereinafter, also referred to as "printing durability") is high is required.

Particularly, in recent years, an ink that is cured by being irradiated with ultraviolet rays (UV) (also referred to as "ultraviolet curable ink") is used as an ink for printing in some cases.

The UV ink has high productivity because the ink can be dried instantly, can easily reduce environmental pollution because the ink usually has a small content of a solvent or does not contain a solvent, and can form an image without being dried with heat or by being dried with heat in a short time, and thus the ink has an advantage that the range of applications for printing targets and the like is expanded.

Therefore, a planographic printing plate precursor that can provide a planographic printing plate having excellent printing durability even in a case of using UV ink is considered to be extremely industrially useful.

As a result of intensive examination on the planographic printing plate precursors described in WO2017/150039A and JP2006-315265A, the present inventors found that the printing durability of the planographic printing plate to be obtained is insufficient in particularly in a case where UV ink is used as an ink.

As a result of intensive examination conducted by the present inventors, it was found that a planographic printing plate precursor from which a planographic printing plate with excellent printing durability (UV printing durability) is obtained even in a case of using ultraviolet curable ink (UV ink) can be provided by employing the above-described configuration.

The detailed mechanism by which the above-described effect is obtained is not clear, but can be assumed as follows.

It is assumed that since the image recording layer contains the organic particle containing a resin that has a constitutional unit A having a cation moiety and a constitutional unit B having an anion moiety, the hardness of the organic particle is enhanced so that an image area with excellent strength can be obtained, and thus the printing durability (UV printing durability) is excellent even in a case where UV ink is used.

Further, it is assumed that since the image recording layer contains the organic particle containing a resin that has a constitutional unit A having a cation moiety and a constitutional unit B having an anion moiety, the image recording layer is likely to be dissolved in or swollen by dampening water and tends to have excellent on-press developability.

<Image Recording Layer>

A planographic printing plate precursor according to the embodiment of the present disclosure is a planographic printing plate precursor including a support and an image recording layer on the support, in which the image recording layer contains an organic particle containing a resin that has a constitutional unit A having a cation moiety and a constitutional unit B having an anion moiety.

The image recording layer used in the present disclosure is preferably a negative type image recording layer and more preferably a water-soluble or water-dispersible negative type image recording layer.

Further, from the viewpoints of the printing durability and the photosensitivity, the image recording layer used in the present disclosure further contains preferably a polymerization initiator and a polymerizable compound and preferably an electron-accepting polymerization initiator and a polymerizable compound.

Further, it is preferable that the image recording layer used in the present disclosure is an on-press development type image recording layer.

Hereinafter, details of each component contained in the image recording layer will be described.

<<Organic Particle Containing Resin that has Constitutional Unit a Having Cation Moiety and Constitutional Unit B Having Anion Moiety>>

The image recording layer in the planographic printing plate precursor according to the embodiment of the present disclosure contains an organic particle (hereinafter, also referred to as "specific particle") containing a resin that has a constitutional unit A having a cation moiety and a constitutional unit B having an anion moiety.

[Resin]

In the image recording layer of the planographic printing plate precursor according to the embodiment of the present disclosure, the resin contained in the specific particle may be an addition polymerization type resin or a polycondensation resin, but from the viewpoints of the UV printing durability and ease of production, the resin includes preferably an addition polymerization type resin, more preferably an acrylic resin, a polyurea resin, or a polyurethane resin, still more preferably an acrylic resin or a polyurethane resin, and particularly preferably an acrylic resin.

As the acrylic resin, a resin in which the content of a constitutional unit formed of a (meth)acrylic compound (a constitutional unit derived from a (meth)acrylic compound) is 50% by mass or greater is preferable.

Suitable examples of the (meth)acrylic compound include a (meth)acrylate compound and a (meth)acrylamide compound.

The resin may be used alone or in combination of two or more kinds thereof.

The resin contained in the specific particle has a constitutional unit A having a cation moiety and a constitutional unit B having an anion moiety. The cation moiety and the anion moiety may be bonded to or dissociated from each other in the image recording layer, but it is preferable that the cation moiety and the anion moiety are bonded to each other.

Constitutional Unit A Having Cation Moiety

The cation moiety in the constitutional unit A having a cation moiety may have a cationic group. The cationic group may form a salt. Examples of the cationic group include an onium group.

Examples of the onium group include a primary amino group, a secondary amino group, an ammonium group, a phosphonium group, an oxonium group, a sulfonium group, a pyridinium group, an imidazolium group, and salts thereof.

Among these, from the viewpoint of the UV printing durability, as the cationic group, a cationic group having a nitrogen atom is preferable, at least one group selected from the group consisting of a pyridinium group, an imidazolium group, a primary amino group, a secondary amino group, a tertiary amino group, a quaternary ammonium group, and salts thereof is more preferable, and at least one group selected from the group consisting of a primary amino group, a secondary amino group, a tertiary amino group, a quaternary ammonium group, and salts thereof is still more preferable.

In a case where the cationic group is an ammonium base ($—NR^A_4M^A$), the counter anion $M^A$ of the ammonium base is not particularly limited, and preferred examples thereof includes a halide ion, a sulfonate anion, and a carboxylate anion. Among these, a halogen anion is more preferable. Further, the counter anion $M^A$ may be a monovalent anion or a divalent or higher valent anion as long as the anion is electrically neutralized.

Further, the constitutional unit A is preferably a constitutional unit having a cation moiety and more preferably a constitutional unit having a cation moiety having a nitrogen atom.

As the monomer forming the constitutional unit A, a monomer having a cation moiety is preferable, a (meth) acrylate compound having a cation moiety, a (meth)acrylamide compound having a cation moiety, or a maleimide compound having a cation moiety is more preferable, and a (meth)acrylate compound having a cation moiety or a (meth) acrylamide compound having a cation moiety is particularly preferable.

Further, the above-described monomer may be a monovalent monomer or a divalent or higher valent monomer.

Further, it is preferable that the monomer is an ethylenically unsaturated compound.

Further, the number of carbon atoms of the constitutional unit A is not particularly limited, but is preferably 5 or greater, more preferably in a range of 5 to 30, and particularly preferably in a range of 6 to 20, from the viewpoint of UV printing durability.

Preferred specific examples of the monomer forming the constitutional unit A include those shown below, but it goes without saying that the present invention is not limited thereto.

First, specific examples of the monomer forming the constitutional unit A having the cation moiety are shown below.

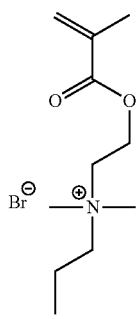

A-1

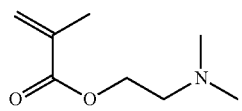

A-2

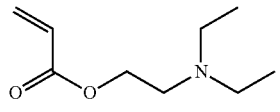

A-3

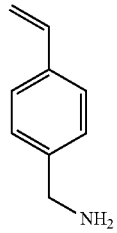

A-4

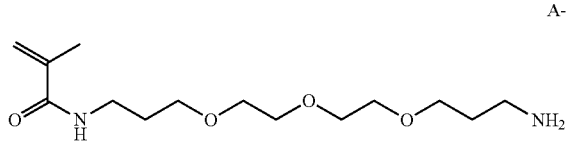

A-5

The resin may have one or two or more kinds of monomers forming the constitutional unit A.

From the viewpoint of the UV printing durability, the content of the constitutional unit A in the resin is preferably greater than 1% by mass, more preferably greater than 5% by mass, still more preferably 15% by mass or greater, particularly preferably 20% by mass or greater, particularly preferably in a range of 25% by mass to 80% by mass, and particularly preferably in a range of 25% by mass to 70% by mass with respect to the total mass of the resin.

—Constitutional Unit B Having Anion Moiety—

The anion moiety in the constitutional unit B having the anion moiety may have an anionic group. The anionic group may form a salt. Examples of the anionic group include a group having an acidic proton such as a sulfonic acid group, a phosphoric acid group, a phosphonic acid group, a carboxylic acid group, or a phenolic hydroxyl group, or salts thereof, and an imide group.

Among these, from the viewpoint of the UV printing durability, as the anionic group, at least one group selected from the group consisting of a carboxylic acid group, a phenolic hydroxyl group, a sulfonic acid group, a phosphoric acid group, salts thereof, and an imide group is preferable, and at least one group selected from the group consisting of a carboxylic acid group, a phenolic hydroxyl group, a sulfonic acid group, a phosphoric acid group, and salts thereof is more preferable.

The counter cation $M^C$ in the sulfonate group ($—SO_3M^C$) or the carboxylate group ($—COOM^C$) is not particularly limited, and preferred examples thereof include an alkali metal cation. Further, the counter cation $M^C$ may be a monovalent cation or a divalent or higher valent cation as long as the cation is electrically neutralized.

As the monomer forming the constitutional unit B, a monomer having an anion moiety is preferable, a (meth) acrylate compound having an anion moiety, a (meth)acrylamide compound having an anion moiety, or a maleimide compound having an anion moiety is more preferable, and a (meth)acrylate compound having a cation moiety or a (meth)acrylamide compound having a cation moiety is particularly preferable.

Further, the above-described monomer may be a monovalent or a divalent or higher valent monomer.

Further, it is preferable that the monomer is an ethylenically unsaturated compound.

Further, the number of carbon atoms of the constitutional unit B is not particularly limited, but is preferably 5 or greater, more preferably in a range of 5 to 30, and particularly preferably in a range of 6 to 20, from the viewpoints of the UV printing durability and the on-press developability.

Specific examples of the monomer forming the constitutional unit B include those shown below, but it goes without saying that the present invention is not limited thereto.

First, specific examples of the monomer forming the constitutional unit B having an anion moiety are shown below.

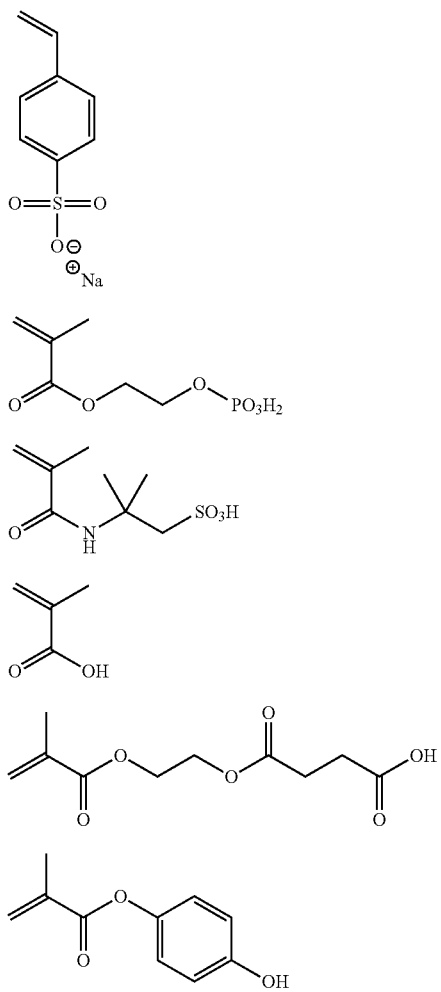

The resin may have only one or two or more kinds of monomers forming the constitutional unit B.

From the viewpoint of the UV printing durability, the content of the constitutional unit B in the resin is preferably greater than 1% by mass, more preferably 5% by mass or greater, still more preferably in a range of 10% by mass to 50% by mass, and particularly preferably in a range of 10% by mass to 40% by mass with respect to the total mass of the resin.

From the viewpoint of the UV printing durability, the total content of the constitutional unit A and the constitutional unit B in the resin contained in the organic particle is preferably greater than 5% by mass, more preferably 20% by mass or greater, still more preferably in a range of 25% by mass to 90% by mass, and even still more preferably in a range of 40% by mass to 65% by mass with respect to the total mass of the resin.

From the viewpoint of the UV printing durability, the total content of the constitutional unit A and the constitutional unit B in the resin (hereinafter, also referred to as the "total content of the constitutional units A and B") is greater than 20% by mass with respect to the total mass of the resin, the content of the constitutional unit A is preferably 10% by mass or greater with respect to the total mass of the resin, the total content of the constitutional units A and B is in a range of 25% by mass to 90% by mass, and the content of the constitutional unit A is more preferably greater than 20% by mass with respect to the total mass of the resin.

The resin may have constitutional units other than the constitutional unit A and the constitutional unit B.

From the viewpoints of the UV printing durability and the on-press developability, it is preferable that the resin further has a constitutional unit containing a hydrophilic group other than the constitutional unit A and the constitutional unit B.

As the hydrophilic group, from the viewpoints of the UV printing durability and the on-press developability, a group having a polyalkylene oxide structure, a group having a polyester structure, or a sulfonic acid group is preferable, a group having a polyalkylene oxide structure or a sulfonic acid group is more preferable, and a sulfonic acid group is still more preferable.

Further, from the viewpoints of the particle dispersibility, the UV printing durability, and the on-press developability, it is particularly preferable that the hydrophilic group is a group having a polyalkylene oxide structure.

Further, from the viewpoints of the UV printing durability and the on-press developability, it is more preferable that the addition polymerization type resin contains a sulfonate group.

From the viewpoint of the on-press developability, a polyethylene oxide structure, a polypropylene oxide structure, or a poly(ethylene oxide/propylene oxide) structure is preferable as the polyalkylene oxide structure.

From the viewpoint of the on-press developability, the number of alkylene oxide structures in the polyalkylene oxide structure is preferably 2 or greater, more preferably 5 or greater, still more preferably in a range of 5 to 200, and particularly preferably in a range of 8 to 150.

The polyester structure is not particularly limited, and preferred examples thereof include a ring-opening polymerization chain of a lactone and a polycondensation chain of hydroxycarboxylic acid.

From the viewpoints of the on-press developability, the number of hydroxycarboxylic acid structures (lactone structures) in the polyester structure is preferably 2 or greater, more preferably in a range of 2 to 20, still more preferably in a range of 2 to 10, and particularly preferably in a range of 4 to 10.

From the viewpoints of the UV printing durability and the on-press developability, it is preferable that the resin has a constitutional unit represented by Formula (D).

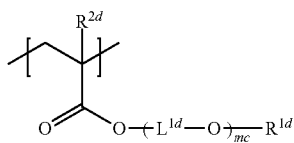

(D)

In Formula D, $L^{1d}$ represents an ethylene group or a propylene group, $R^{1d}$ represents a hydrogen atom, an alkyl group, or an aryl group, $R^{2d}$ represents a hydrogen atom or a methyl group, and mc represents an integer of 2 to 200.

It is preferable that $L^{1d}$ represents an ethylene group or a 1,2-propylene group.

$R^{1d}$ represents preferably a hydrogen atom, an alkyl group having 1 to 4 carbon atoms, or a phenyl group, more preferably a hydrogen atom or an alkyl group having 1 to 4 carbon atoms, and still more preferably a hydrogen atom or a methyl group.

mc represents preferably an integer of 2 to 200, more preferably 2 to 100, and still more preferably 2 to 50.

Further, from the viewpoint of the on-press developability, it is preferable that the hydrophilic group is a group represented by Formula Z.

Further, from the viewpoint of the on-press developability, it is preferable that the addition polymerization type resin has a constitutional unit containing a group represented by Formula Z.

-Q-W—Y                    Formula Z

In Formula Z, Q represents a divalent linking group, W represents a divalent group having a hydrophilic structure or a divalent group having a hydrophobic structure, and Y represents a monovalent group having a hydrophilic structure or a monovalent group having a hydrophobic structure, where any of W and Y has a hydrophilic structure.

Q represents preferably a divalent linking group having 1 to 20 carbon atoms and more preferably a divalent linking group having 1 to 10 carbon atoms.

Further, Q represents preferably an alkylene group, an arylene group, an ester bond, an amide bond, or a group formed by combining two or more of these groups and more preferably a phenylene group, an ester bond, or an amide bond.

It is preferable that the divalent group having a hydrophilic structure as W is a polyalkyleneoxy group or a group in which —$CH_2CH_2NR^W$— is bonded to one terminal of a polyalkyleneoxy group. Further, $R^W$ represents a hydrogen atom or an alkyl group.

It is preferable that the divalent group having a hydrophobic structure as W is —$R^{WA}$—, —O—$R^{WA}$—O—, —$R^W$N—$R^{WA}$—$NR^W$—, —OOC—$R^{WA}$—O—, or —OOC—$R^{WA}$—O—. Further, $R^{WA}$'s each independently represent a linear, branched, or cyclic alkylene group having 6 to 120 carbon atoms, a haloalkylene group having 6 to 120 carbon atoms, an arylene group having 6 to 120 carbon atoms, an alkarylene group having 6 to 120 carbon atoms (a divalent group obtained by removing one hydrogen atom from an alkylaryl group), or an aralkylene group having 6 to 120 carbon atoms.

It is preferable that the monovalent group having a hydrophilic structure as Y is OH, COOH, a polyalkyleneoxy group having a hydrogen atom or an alkyl group at a terminal, or a group in which —$CH_2CH_2N(R^W)$— is bonded to a terminal of a polyalkyleneoxy group having a hydrogen atom or an alkyl group at the other terminal.

It is preferable that the monovalent group having a hydrophobic structure as Y is a linear, branched, or cyclic alkyl group having 6 to 120 carbon atoms, a haloalkyl group having 6 to 120 carbon atoms, an aryl group having 6 to 120 carbon atoms, an alkaryl group (an alkylaryl group) 6 to 120 carbon atoms, an aralkyl group having 6 to 120 carbon atoms, $OR^{WB}$, $COOR^{WB}$, or $OOCR^{WB}$. Further, $R^{WB}$ represents an alkyl group having 6 to 20 carbon atoms.

Preferred specific examples of the constitutional unit containing a hydrophilic group include those shown below, but it goes without saying that the present invention is not limited thereto.

In addition, nc represents an integer of 2 or greater and preferably an integer of 2 to 200.

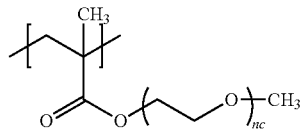

D-1

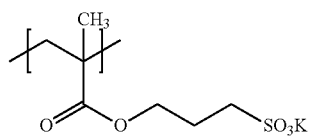

D-2

The resin may have only one or two or more kinds of the constitutional units containing a hydrophilic group.

From the viewpoint of the on-press developability, the content of the constitutional unit containing a hydrophilic group is preferably 1% by mass or greater and less than 20% by mass, more preferably in a range of 1% by mass to 18% by mass, and particularly preferably in a range of 2% by mass to 15% by mass with respect to the total mass of the addition polymerization type resin.

From the viewpoint of the UV printing durability, it is preferable that the resin further has a constitutional unit having an aromatic ring other than the constitutional unit A and the constitutional unit B.

The aromatic ring may be an aromatic hydrocarbon ring, a heteroaromatic ring, or a fused ring thereof, but an aromatic hydrocarbon ring is preferable, and a benzene ring is more preferable.

The number of aromatic rings in the constitutional unit having the aromatic rings is not particularly limited, but is preferably in a range of 1 to 4, more preferably 1 or 2, and particularly preferably 1.

Preferred examples of the monomer forming the constitutional unit having an aromatic ring include a styrene compound, a (meth)acrylate compound having an aromatic ring, and a (meth)acrylamide compound having an aromatic ring.

Further, the above-described monomer may be a monovalent monomer or a divalent or higher valent monomer.

Further, it is preferable that the monomer is an ethylenically unsaturated compound.

Further, the number of carbon atoms of the constitutional unit having an aromatic ring is not particularly limited, but is preferably 8 or greater, more preferably in a range of 8 to 30, and particularly preferably in a range of 8 to 20, from the viewpoint of the UV printing durability.

Preferred specific examples of the constitutional unit having an aromatic ring include those shown below, but it goes without saying that the present invention is not limited thereto.

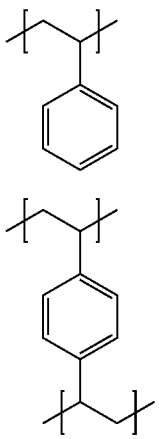

The resin may have only one or two or more kinds of the constitutional units having an aromatic ring.

From the viewpoint of the on-press developability, the content of the constitutional unit having an aromatic ring is preferably in a range of 10% by mass to 90% by mass, more preferably in a range of 20% by mass to 80% by mass, and particularly preferably in a range of 35% by mass to 75% by mass with respect to the total mass of the resin.

The resin may have a constitutional unit other than the above-described constitutional units (hereinafter, also referred to as "other constitutional units").

Preferred examples of compounds forming other constitutional units include ethylenically unsaturated compounds such as a styrene compound, a (meth)acrylate compound, a (meth)acrylamide compound, a (meth)acrylonitrile compound, a vinyl halide compound, a vinyl ester compound, a vinyl ether compound, and an α-olefin compound.

The resin may have only one or two or more other constitutional units or may not have other constitutional units.

From the viewpoints of the UV printing durability and the on-press developability, the content of other constitutional units in the resin is preferably 50% by mass or less, more preferably 30% by mass or less, still more preferably 10% by mass or less, and particularly preferably 5% by mass or less with respect to the total mass of the resin.

The weight-average molecular weight (Mw) of the resin is not particularly limited, but is preferably 2000 or greater, more preferably 5000 or greater, and still more preferably in a range of 10000 to 2000000.

The specific particle may contain only one or two or more kinds of the resins.

From the viewpoint of the UV printing durability, the content of the resin in the specific particle is preferably 50% by mass or greater, more preferably 60% by mass or greater, and particularly preferably in a range of 70% by mass to 100% by mass with respect to the total mass of the specific particle.

Further, it is preferable that the specific particle is a surface-modified particle.

A surface modification method is not particularly limited, and a known method can be used. Examples of the known surface modification method include a method of allowing a compound containing a reactive group to react with the surface of a particle and a method of coating the surface of a particle with a compound such as a polymer.

Preferable examples of the reactive group include an epoxy group and an oxetanyl group.

Further, since the specific particle has a hydrogen bond-donating site, it is also preferable that the surface of a particle is coated with a polymer having a hydrogen bond-accepting site or a polymer having a hydrogen bond-accepting site and a hydrogen bond-donating site.

From the viewpoints of the UV printing durability and the on-press developability, the specific particle includes preferably a particle having a polymerizable group on the surface thereof and more preferably a particle having an ethylenically unsaturated group on the surface thereof.

Preferred examples of a method of introducing a polymerizable group such as an ethylenically unsaturated group to the surface of a particle include a method of allowing a compound containing an ethylenically unsaturated group and an epoxy group to react with a hydroxy group or the like that is present on the surface of a particle.

Further, from the viewpoint of the UV printing durability, it is preferable that the specific particle is a particle having a crosslinked structure.

From the viewpoints of the developability and the UV printing durability, the volume average particle diameter of the specific particle is preferably in a range of 10 nm to 1000 nm, more preferably in a range of 20 nm to 500 nm, still more preferably in a range of 50 nm to 300 nm, and particularly preferably in a range of 70 nm to 200 nm.

The average particle diameter of the particle in the present disclosure is obtained by measuring the diameter of each particle according to a light scattering method or capturing an electron micrograph of the particles and measuring the particle diameters of a total of 5000 particles on the photograph, and calculating the average value thereof. Further, the particle diameter of a spherical particle having the same particle area as the particle area on the photograph is set as the particle diameter of a non-spherical particle.

Further, the average particle diameter in the present disclosure is the volume average particle diameter unless otherwise specified.

Specific suitable examples of the resin (preferably an addition polymerization type resin) used in the present disclosure and the specific particle include those used in the examples described below, but it goes without saying that the present invention is not limited thereto.

The image recording layer may contain one or two or more kinds of specific particles.

From the viewpoints of the UV printing durability and the on-press developability, the content of the specific particle is preferably in a range of 10% by mass to 70% by mass, more preferably in a range of 20% by mass to 65% by mass, and particularly preferably in a range of 30% by mass to 65% by mass with respect to the total mass of the image recording layer.

Infrared Absorbing Agent

It is preferable that the image recording layer further contains an infrared absorbing agent.

Examples of the infrared absorbing agents include pigments and dyes.

As dyes used as infrared absorbing agents, commercially available dyes and known dyes described in the literatures such as "Dye Handbook" (edited by the Society of Synthetic Organic Chemistry, Japan, published in 1970) can be used. Specific examples thereof include dyes such as an azo dye, a metal complex salt azo dye, a pyrazolone azo dye, a naphthoquinone dye, an anthraquinone dye, a phthalocyanine dye, a carbonium dye, a quinone imine dye, a methine dye, a cyanine dye, a squarylium coloring agent, a pyrylium salt, and a metal thiolate complex.

Among the above-described dyes, a cyanine coloring agent, a squarylium coloring agent, a pyrylium salt, a nickel thiolate complex, and an indolenine cyanine coloring agent are particularly preferable. Further, other examples thereof include a cyanine coloring agent and an indolenine cyanine coloring agent. Among these, a cyanine coloring agent is particularly preferable.

Specific examples of the cyanine coloring agent include compounds described in paragraphs 0017 to 0019 of JP2001-133969A and compounds described in paragraphs 0016 to 0021 of JP2002-023360A and paragraphs 0012 to 0037 of JP2002-040638A, preferred examples thereof include compounds described in paragraphs 0034 to 0041 of JP2002-278057A and paragraphs 0080 to 0086 of JP2008-195018A, and particularly preferred examples thereof include compounds described in paragraphs 0035 to 0043 of JP2007-90850A and compounds described in paragraphs 0105 to 0113 of JP2012-206495A.

Further, compounds described in paragraphs 0008 and 0009 of JP1993-5005A (JP-H05-5005A) and paragraphs 0022 to 0025 of JP2001-222101A can be preferably used.

As the pigments, compounds described in paragraphs 0072 to 0076 of JP2008-195018A are preferable.

Further, an infrared absorbing agent that is decomposed upon exposure to infrared rays (also referred to as a "decomposable infrared absorbing agent") can also be suitably used.

Further, as the infrared absorbing agent that is decomposed by exposure to infrared rays, those described in JP2008-544322A or WO2016/027886A can be suitably used.

The infrared absorbing agent may be used alone or in combination of two or more kinds thereof. Further, pigments and dyes may be used in combination as the infrared absorbing agent.

The content of the infrared absorbing agent in the image recording layer is preferably in a range of 0.1% by mass to 10.0% by mass and more preferably in a range of 0.5% by mass to 5.0% by mass with respect to total mass of the image recording layer.

Polymerization Initiator

Further, the image recording layer of the planographic printing plate precursor according to the embodiment of the present disclosure further contains preferably a polymerization initiator and more preferably a polymerization initiator and a polymerizable compound.

Further, it is preferable that the image recording layer contains an electron-accepting polymerization initiator as the polymerization initiator.

<Electron-Accepting Polymerization Initiator>

It is preferable that the image recording layer contains an electron-accepting polymerization initiator (hereinafter, also referred to as a "polymerization assistant") as the polymerization initiator.

The electron-accepting polymerization initiator is a compound that generates polymerization initiating species such as a radical by accepting an electron through intermolecular electron transfer in a case where electrons of the infrared absorbing agent are excited upon exposure to infrared rays.

The electron-accepting polymerization initiator used in the present disclosure is a compound that generates polymerization initiating species such as a radical or a cation by light, heat, or the energy of both light and heat and can be appropriately selected from known thermal polymerization initiators, compounds having bonds with small bond dissociation energy, and photopolymerization initiators and then used.

As the electron-accepting polymerization initiator, a radical polymerization initiator is preferable, and an onium salt compound is more preferable.

Further, an infrared photosensitive polymerization initiator is preferable as the electron-accepting polymerization initiator.

Examples of the electron-accepting radical polymerization initiator include an organic halide (a), a carbonyl compound (b), an azo compound (c), an organic peroxide (d), a metallocene compound (e), an azide compound (f), a hexaaryl biimidazole compound (g), a disulfone compound (i), an oxime ester compound (j), and an onium salt compound (k).

As the organic halide (a), for example, the compounds described in paragraphs 0022 to 0023 of JP2008-195018A are preferable.

As the carbonyl compound (b), for example, the compounds described in paragraph 0024 of JP2008-195018A are preferable.

As the azo compound (c), for example, the azo compounds and the like described in JP1996-108621A (JP-H08-108621A) can be used.

As the organic peroxide (d), for example, the compounds described in paragraph 0025 of JP2008-195018A are preferable.

As the metallocene compound (e), for example, the compounds described in paragraph 0026 of JP2008-195018A are preferable.

Examples of the azide compound (f) include compounds such as 2,6-bis(4-azidobenzylidene)-4-methylcyclohexanone.

As the hexaarylbiimidazole compound (g), for example, the compounds described in paragraph 0027 of JP2008-195018A are preferable.

Examples of the disulfone compound (i) include the compounds described in JP1986-166544A (JP-S61-166544A) and JP2002-328465A.

As the oxime ester compound (j), for example, the compounds described in paragraphs 0028 to 0030 of JP2008-195018A are preferable.

Among the above-described electron-accepting polymerization initiators, an oxime ester compound and an onium salt compound are preferable from the viewpoint of the curability. Among these, from the viewpoint of the printing durability, an iodonium salt compound, a sulfonium salt compound, or an azinium salt compound is preferable, an iodonium salt compound or a sulfonium salt compound is more preferable, and an iodonium salt compound is particularly preferable.

Hereinafter, specific examples of these compounds will be described, but the present disclosure is not limited thereto.

As an example of the iodonium salt compound, a diaryl iodonium salt compound is preferable, and particularly a diphenyl iodonium salt compound substituted with an electron-donating group such as an alkyl group or an alkoxyl group is more preferable. Further, an asymmetric diphenyl iodonium salt compound is preferable. Specific examples thereof include diphenyliodonium=hexafluorophosphate, 4-methoxyphenyl-4-(2-methylpropyl)phenyliodonium=hexafluorophosphate, 4-(2-methylpropyl)phenyl-p-tolyliodonium=hexafluorophosphate, 4-hexyloxyphenyl-2,4,6-trimethoxyphenyliodonium=hexafluorophosphate, 4-hexyloxyphenyl-2,4-diethoxyphenyliodonium=tetrafluoroborate, 4-octyloxyphenyl-2,4,6-trimethoxyphenyliodonium=1-perfluorobutane sulfonate, 4-octyloxyphenyl-2,4,6-trimethoxyphenyliodonium=hexafluorophosphate, and bis(4-t-butylphenyl)iodonium=hexafluorophosphate.

As an example of the sulfonium salt compound, a triarylsulfonium salt compound is preferable, a triarylsulfonium salt compound in which at least some groups on an aromatic ring such as electron-withdrawing groups have been substituted with halogen atoms is particularly preferable, and a triarylsulfonium salt compound in which the total number of halogen atoms substituted on an aromatic ring is 4 or greater is still more preferable. Specific examples thereof include triphenylsulfonium=hexafluorophosphate, triphenylsulfonium=benzoylformate, bis(4-chlorophenyl)phenylsulfonium=benzoylformate, bis(4-chlorophenyl)-4-methylphenylsulfonium=tetrafluoroborate, tris(4-chlorophenyl)sulfonium=3,5-bis(methoxycarbonyl)benzene sulfonate, tris(4-chlorophenyl)sulfonium=hexafluorophosphate, and tris(2,4-dichlorophenyl)sulfonium=hexafluorophosphate.

Further, as the counter anion of the iodonium salt compound and the sulfonium salt compound, a sulfonamide anion or a sulfonimide anion is preferable, and a sulfonimide anion is more preferable.

As the sulfonamide anion, an aryl sulfonamide anion is preferable.

Further, as the sulfonimide anion, a bisaryl sulfonimide anion is preferable.

Specific examples of the sulfonamide anion or the sulfonimide anion are shown below, but the present disclosure is not limited thereto. In the specific examples below, Ph represents a phenyl group, Me represents a methyl group, and Et represents an ethyl group.

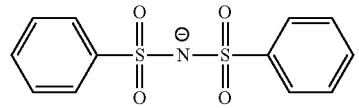

I-1

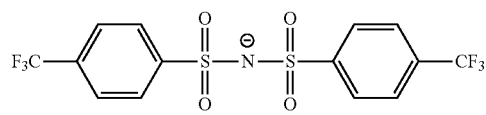

I-2

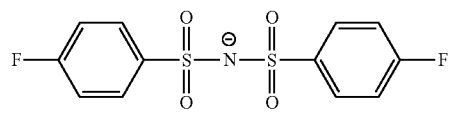

I-3

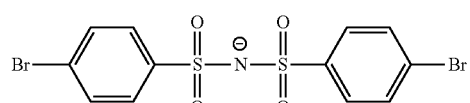

I-4

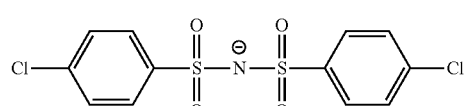

I-5

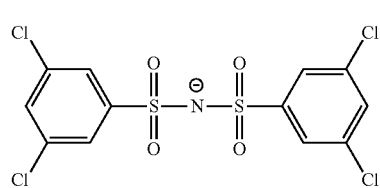

I-6

-continued

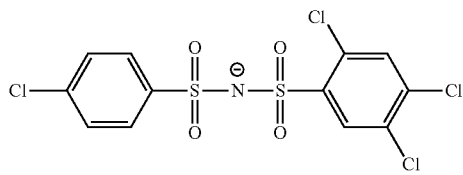

I-7

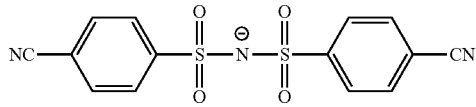

I-8

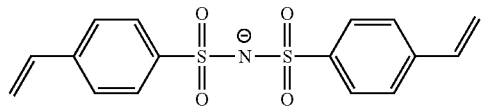

I-9

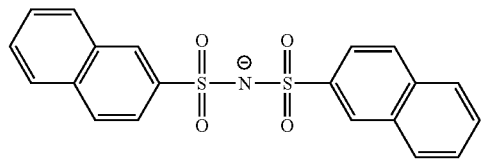

I-10

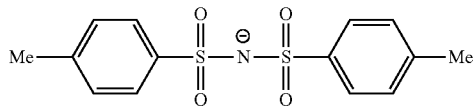

I-11

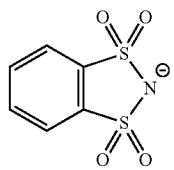

I-12

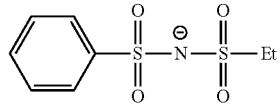

I-13

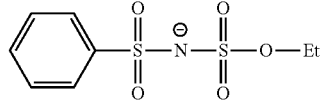

I-14

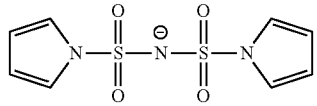

I-15

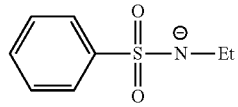

I-16

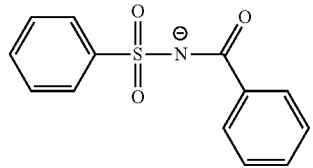

I-17

I-18 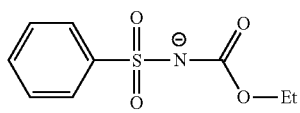

I-19 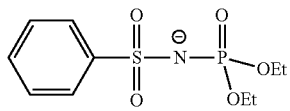

I-20 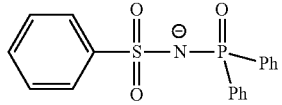

I-21 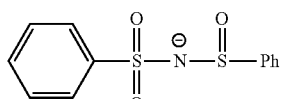

I-22 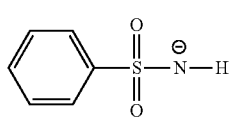

I-23 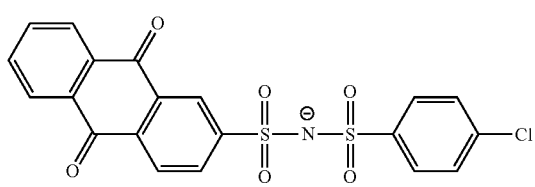

I-24 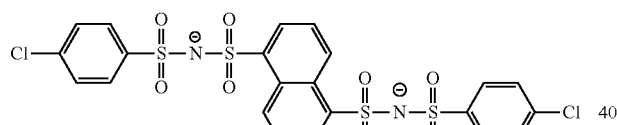

I-25 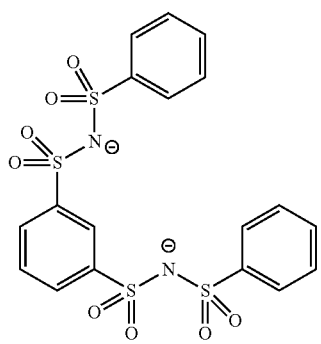

I-26 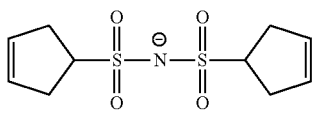

The electron-accepting polymerization initiator may be used alone or in combination of two or more kinds thereof.

The content of the electron-accepting polymerization initiator is preferably in a range of 0.1% by mass to 50% by mass, more preferably in a range of 0.5% by mass to 30% by mass, and particularly preferably in a range of 0.8% by mass to 20% by mass with respect to the total mass of the image recording layer.

<<Electron-Donating Polymerization Initiator (Polymerization Assistant)>>

The image recording layer contains preferably an electron-donating polymerization initiator (also referred to as a "polymerization assistant") and more preferably an electron-accepting polymerization initiator and a polymerization assistant as the polymerization initiator.

The electron-donating polymerization initiator in the present disclosure is a compound that generates polymerization initiating species such as a radical by donating one electron, through intermolecular electron transfer, to the orbit where one electron of the infrared absorbing agent is escaped in a case where electrons of the infrared absorbing agent are excited or transferred between molecules upon exposure to infrared rays.

It is preferable that the electron-donating polymerization initiator is an electron-donating radical polymerization initiator.

From the viewpoint of improving the printing durability of the planographic printing plate, it is more preferable that the image recording layer contains the electron-donating polymerization initiator described below, and examples thereof include the following five kinds of polymerization initiators.

(i) Alkyl or arylate complex: It is considered that a carbon-hetero bond is cleaved by oxidation to generate an active radical. Specifically, a borate compound is preferable.

(ii) N-arylalkylamine compound: It is considered that a C—X bond on carbon adjacent to nitrogen is cleaved by oxidation to generate an active radical. It is preferable that X represents a hydrogen atom, a carboxyl group, a trimethylsilyl group, or a benzyl group. Specific examples thereof include N-phenylglycines (the phenyl group may or may not have a substituent) and N-phenyliminodiacetic acid (the phenyl group may or may not have a substituent).

(iii) Sulfur-containing compound: The nitrogen atom of the above-described amines can be replaced with a sulfur atom to generate an active radical by the same action as described above. Specific examples thereof include phenylthioacetic acid (the phenyl group may or may not have a substituent).

(iv) Tin-containing compound: The nitrogen atom of the above-described amines can be replaced with a tin atom to generate an active radical by the same action as described above.

(v) Sulfinates: An active radical can be generated by oxidation. Specific examples thereof include sodium arylsulfinate.

Among these, it is preferable that the image recording layer contains a borate compound from the viewpoints of the printing durability and the color developability.

From the viewpoints of the printing durability and the color developability, a tetraaryl borate compound or a monoalkyl triaryl borate compound is preferable, and a tetraaryl borate compound is more preferable as the borate compound.

The counter cation of the borate compound is not particularly limited, and an alkali metal ion or a tetraalkylammonium ion is preferable, and a sodium ion, a potassium ion, or a tetrabutylammonium ion is more preferable.

Specific preferred examples of the borate compound include sodium tetraphenyl borate.

B-1 to B-9 are shown below as specific preferred examples of the electron-donating polymerization initiator, but it goes without saying that the present invention is not limited thereto. Further, in the following chemical formulae, Ph represents a phenyl group, and Bu represents an n-butyl group.

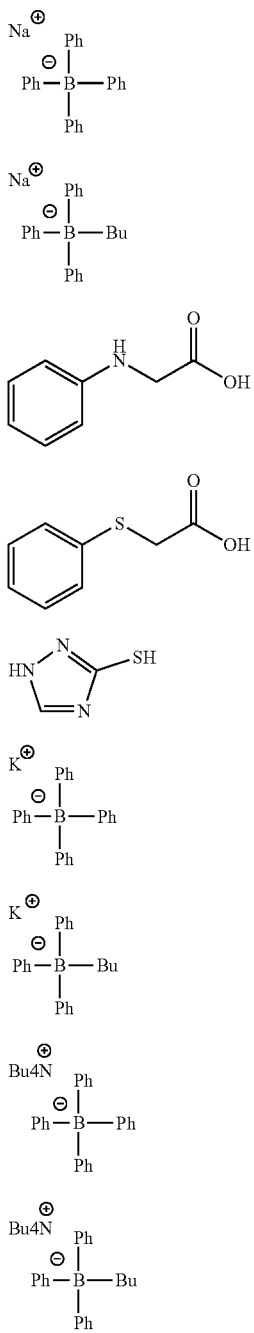

The electron-donating polymerization initiator may be used alone or in combination of two or more kinds thereof.

From the viewpoints of the color developability and the property of suppressing discoloration with time, the content of the electron-donating polymerization initiator is preferably in a range of 0.01% by mass to 30% by mass, more preferably in a range of 0.05% by mass to 25% by mass, and still more preferably in a range of 0.1% by mass to 20% by mass with respect to the total mass of the image recording layer.

Polymerizable Compound

It is preferable that the image recording layer contains a polymerizable compound.

The polymerizable compound used in the present disclosure may be, for example, a radically polymerizable compound or a cationically polymerizable compound, but it is preferable that the polymerizable compound is an addition polymerizable compound having at least one ethylenically unsaturated bond (ethylenically unsaturated compound). As the ethylenically unsaturated compound, a compound having at least one terminal ethylenically unsaturated bond is preferable, and a compound having two or more terminal ethylenically unsaturated bonds is more preferable. The polymerizable compound may have a chemical form such as a monomer, a pre-polymer, that is, a dimer, a trimer, or an oligomer, or a mixture thereof.

Examples of the monomer include unsaturated carboxylic acids (for example, acrylic acid, methacrylic acid, itaconic acid, crotonic acid, isocrotonic acid, or maleic acid), esters thereof, and amides thereof. Among these, esters of unsaturated carboxylic acids and polyhydric alcohol compounds, and amides of unsaturated carboxylic acids and polyhydric amine compounds are preferably used. Further, an addition reaction product of unsaturated carboxylic acid esters having a nucleophilic substituent such as a hydroxy group, an amino group, or a mercapto group or amides with monofunctional or polyfunctional isocyanates or epoxies, and a dehydration condensation reaction product with a monofunctional or polyfunctional carboxylic acid are also suitably used. Further, an addition reaction product of unsaturated carboxylic acid esters having an electrophilic substituent such as an isocyanate group or an epoxy group or amides with monofunctional or polyfunctional alcohols, amines, and thiols, and a substitution reaction product of unsaturated carboxylic acid esters having a releasable substituent such as a halogen atom or a tosyloxy group or amides with monofunctional or polyfunctional alcohols, amines, and thiols are also suitable. As another example, a compound group in which the unsaturated carboxylic acid is substituted with unsaturated phosphonic acid, styrene, vinyl ether, or the like can also be used. These compounds are described in JP2006-508380A, JP2002-287344A, JP2008-256850A, JP2001-342222A, JP1997-179296A (JP-H09-179296A), JP1997-179297A (JP-H09-179297A), JP1997-179298A (JP-H09-179298A), JP2004-294935A, JP2006-243493, JP2002-275129A, JP2003-64130A, JP2003-280187A, and JP1998-333321A (JP-H10-333321A).

Specific examples of the monomer of the ester of a polyhydric alcohol compound and an unsaturated carboxylic acid include acrylic acid ester such as ethylene glycol diacrylate, 1,3-butanediol diacrylate, tetramethylene glycol diacrylate, propylene glycol diacrylate, trimethylolpropane triacrylate, hexanediol diacrylate, tetraethylene glycol diacrylate, pentaerythritol tetraacrylate, sorbitol triacrylate, isocyanuric acid ethylene oxide (EO) modified triacrylate, and a polyester acrylate oligomer. Examples of the methacrylic acid ester include tetramethylene glycol dimethacrylate, neopentyl glycol dimethacrylate, trimethylolpropane trimethacrylate, ethylene glycol dimethacrylate, pentaerythritol trimethacrylate, bis[p-(3-methacryloxy-2-hydroxypropoxy)phenyl]dimethylmethane, and bis[p-(methacryloxyethoxy)phenyl]dimethylmethane. Further, specific examples of the monomer of the amide of a polyvalent amine compound and an unsaturated carboxylic acid include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide, and xylylene bismethacrylamide.

Further, a urethane-based addition-polymerizable compound produced by the addition reaction of an isocyanate and a hydroxy group is also suitable, and specific examples thereof include a vinyl urethane compound containing two or more polymerizable vinyl groups in one molecule, which is obtained by adding a vinyl monomer containing a hydroxy group represented by Formula (M) to a polyisocyanate compound containing two or more isocyanate groups in one molecule described in JP1973-41708B (JP-S48-41708B).

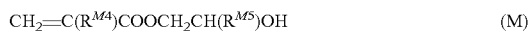

$CH_2=C(R^{M4})COOCH_2CH(R^{M5})OH$ (M)

In Formula (M), $R^{M4}$ and $R^{M5}$ each independently represent a hydrogen atom or a methyl group.

Further, suitable examples of the urethane compound include urethane acrylates described in JP1976-37193A (JP-S51-37193A), JP1990-32293B (JP-H02-32293B), JP1990-16765B (JP-H02-16765B), JP2003-344997A, and JP2006-65210A, urethane compounds having an ethylene oxide skeleton described in JP1983-49860B (JP-S58-49860B), JP1981-17654B (JP-S56-17654B), JP1987-39417B (JP-S62-39417B), JP1987-39418B (JP-S62-39418B), JP2000-250211A, and JP2007-94138A, and urethane compounds containing a hydrophilic group described in U.S. Pat. No. 7,153,632A, JP1996-505958A (JP-H08-505958A), JP2007-293221A, and JP2007-293223A.

The details of the method of using the polymerizable compound such as the structure of the polymerizable compound, whether the polymerizable compound is used alone or in combination, and the amount of addition can be optionally set.

The content of the polymerizable compound is preferably in a range of 5% by mass to 75% by mass, more preferably in a range of 10% by mass to 70% by mass, and particularly preferably in a range of 15% by mass to 60% by mass with respect to the total mass of the image recording layer.

Binder Polymer

It is preferable that the image recording layer further contains a binder polymer.

Preferred examples of the binder polymer include a (meth)acrylic resin, a polyvinyl acetal resin, and a polyurethane resin.

Among these, as the binder polymer, a known binder polymer used in the image recording layer of the planographic printing plate precursor can be suitably used. As an example, the binder polymer used in the on-press development type planographic printing plate precursor (hereinafter, also referred to as a binder polymer for on-press development) will be described in detail.

As the binder polymer for on-press development, a binder polymer having an alkylene oxide chain is preferable. The binder polymer having an alkylene oxide chain may have a poly(alkylene oxide) moiety in the main chain or in a side chain. Further, the binder polymer may be a graft polymer having poly(alkylene oxide) in a side chain or a block copolymer of a block formed of a poly(alkylene oxide)-containing repeating unit and a block formed of an (alkylene oxide)-free repeating unit.

A polyurethane resin is preferable in a case where the binder polymer has a poly(alkylene oxide) moiety in the main chain. Examples of the polymer of the main chain in a case of having a poly(alkylene oxide) moiety in a side chain include a (meth)acrylic resin, a polyvinyl acetal resin, a polyurethane resin, a polyurea resin, a polyimide resin, a polyamide resin, an epoxy resin, a polystyrene resin, a novolak type phenol resin, a polyester resin, synthetic rubber, and natural rubber. Among these, a (meth)acrylic resin is particularly preferable.

Further, other preferred examples of the binder polymer include a polymer compound (hereinafter, also referred to as a "star type polymer compound") which has a polymer chain bonded to a nucleus through a sulfide bond by using a hexa— to decafunctional polyfunctional thiol as the nucleus and in which the polymer chain contains a polymerizable group. As the star type polymer compound, for example, compounds described in JP2012-148555A can be preferably used.

Examples of the star type polymer compound include compounds having a polymerizable group such as an ethylenically unsaturated bond in the main chain or in a side chain and preferably in a side chain for improving coated-film hardness of an image area as described in JP2008-195018A. Crosslinking occurs between polymer molecules by a polymerizable group so that curing is promoted.

Preferred examples of the polymerizable group include an ethylenically unsaturated group such as a (meth)acryl group, a vinyl group, an allyl group, or a styryl group and an epoxy group. Among these, from the viewpoint of polymerization reactivity, a (meth)acryl group, a vinyl group, or a styryl group is more preferable and a (meth)acryl group is particularly preferable. These groups can be introduced to a polymer by a polymer reaction or copolymerization. For example, a reaction between a polymer having a carboxy group in a side chain thereof and glycidyl methacrylate or a reaction between a polymer having an epoxy group and ethylenically unsaturated group-containing carboxylic acid such as methacrylic acid can be used. These groups may be used in combination.

The weight-average molecular weight (Mw) of the binder polymer in terms of polystyrene that is measured according to the GPC method is preferably 2000 or greater, more preferably 5000 or greater, and still more preferably in a range of 10000 to 300000.

As necessary, hydrophilic polymers such as polyvinyl alcohol and polyacrylic acid described in JP2008-195018A can be used in combination. Further, a lipophilic polymer and a hydrophilic polymer can be used in combination.

In the image recording layer used in the present disclosure, the binder polymer may be used alone or in combination of two or more kinds thereof.

The image recording layer may contain an optional amount of the binder polymer, and the content of the binder polymer is preferably in a range of 1% by mass to 90% by mass and more preferably in a range of 5% by mass to 80% by mass with respect to the total mass of the image recording layer.

Acid Color Former

It is preferable that the image recording layer contains an acid color former (hereinafter, also simply referred to as an "acid color former").

The "acid color former" used in the present disclosure indicates a compound that exhibits a color-developing property by being heated in a state of accepting an electron-accepting compound (for example, a proton such as an acid). As the acid color former, a colorless compound which has a partial skeleton such as a lactone, a lactam, a sultone, a spiropyran, an ester, or an amide and in which these partial skeletons are rapidly ring-opened or cleaved in a case of being brought into contact with an electron-accepting compound is preferable.

Examples of such an acid color former include phthalides such as 3,3-bis(4-dimethylaminophenyl)-6-dimethylaminophthalide (referred to as "crystal violet lactone"), 3,3-bis(4-dimethylaminophenyl)phthalide, 3-(4-dimethylaminophenyl)-3-(4-diethylamino-2-methylphenyl)-6-dimethylaminophthalide, 3-(4-dimethylaminophenyl)-3-(1,2-dimethylindol-3-yl)phthalide, 3-(4-dimethylaminophenyl)-3-(2-methylindol-3-yl)phthalide, 3,3-bis(1,2-dimethylindol-3-yl)-5-dimethylaminophthalide, 3,3-bis(1,2-dimethylindol-3-yl)-6-dimethylaminophthalide, 3,3-bis(9-ethylcarbazol-3-yl)-6-dimethylaminophthalide, 3,3-bis(2-phenylindol-3-yl)-6-dimethylaminophthalide, and 3-(4-dimethylaminophenyl)-3-(1-methylpyrrol-3-yl)-6-dimethylaminophthalide, 3,3-bis[1,1-bis(4-dimethylaminophenyl)ethylene-2-yl]-4,5,6,7-tetrachlorophthalide, 3,3-bis[1,1-bis(4-pyrrolidinophenyl)ethylene-2-yl]-4,5,6,7-tetrabromophthalide, 3,3-bis[1-(4-dimethylaminophenyl)-1-(4-methoxyphenyl)ethylene-2-yl]-4,5,6,7-tetrachlorophthalide, 3,3-bis[1-(4-pyrrolidinophenyl)-1-(4-methoxyphenyl)ethylene-2-yl]4,5,6,7-tetrachlorophthalide, 3-[1,1-di(1-ethyl-2-methylindol-3-yl)ethylene-2-yl]-3-(4-diethylaminophenyl)phthalide, 3-[1,1-di(1-ethyl-2-methylindol-3-yl)ethylene-2-yl]-3-(4-N-ethyl-N-phenylaminophenyl)phthalide, 3-(2-ethoxy-4-diethylaminophenyl)-3-(1-n-octyl-2-methylindol-3-yl)-phthalide, 3,3-bis(1-n-octyl-2-methylindol-3-yl)-phthalide, and 3-(2-methyl-4-diethylaminophenyl)-3-(1-n-octyl-2-methylindol-3-yl)-phthalide, 4,4-bis-dimethylaminobenzhydrinbenzylether, N-halophenyl-leucoauramine, N-2,4,5-trichlorophenyl leucoauramine, rhodamine-B-anilinolactam, rhodamine-(4-nitroanilino)lactam, rhodamine-B-(4-chloroanilino)lactam, 3,7-bis(diethylamino)-10-benzoylphenoxazine, benzoyl leucomethylene blue, and 4-nitrobenzoyl methylene blue, fluorans such as 3,6-dimethoxyfluoran, 3-dimethylamino-7-methoxyfluoran, 3-diethylamino-6-methoxyfluoran, 3-diethylamino-7-methoxyfluoran, 3-diethylamino-7-chlorofluoran, 3-diethylamino-6-methyl-7-chlorofluoran, 3-diethylamino-6,7-dimethylfluoran, 3-N-cyclohexyl-N-n-butylamino-7-methylfluoran, 3-diethylamino-7-dibenzylaminofluoran, 3-diethylamino-7-octylaminofluoran, 3-diethylamino-7-di-n-hexylaminofluoran, 3-diethylamino-7-anilinofluoran, 3-diethylamino-7-(2'-fluorophenylamino)fluoran, 3-diethylamino-7-(2'-chlorophenylamino)fluoran, 3-diethylamino-7-(3'-chlorophenylamino)fluoran, 3-diethylamino-7-(2',3'-dichlorophenylamino)fluoran, 3-diethylamino-7-(3'-trifluoromethylphenylamino)fluoran, 3-di-n-butylamino-7-(2'-fluorophenylamino)fluoran, 3-di-n-butylamino-7-(2'chlorophenylamino)fluoran, 3-N-isopentyl-N-ethylamino-7-(2'-chlorophenylamino)fluoran, 3-N-n-hexyl-N-ethylamino-7-(2'-chlorophenylamino)fluoran, 3-diethylamino-6-chloro-7-anilinofluoran, 3-di-n-butylamino-6-chloro-7-anilinofluoran, 3-diethylamino-6-methoxy-7-anilinofluoran, 3-di-n-butylamino-6-ethoxy-7-anilinofluoran, 3-pyrrolidino-6-methyl-7-anilinofluoran, 3-pyrrolidino-6-methyl-7-anilinofluoran, 3-morpholino-6-methyl-7-anilinofluoran, 3-dimethylamino-6-methyl-7-anilinofluoran, 3-diethylamino-6-methyl-7-anilinofluoran, 3-di-n-butylamino-6-methyl-7-anilinofluoran, 3-di-n-pentylamino-6-methyl-7-anilinofluoran, 3-N-ethyl-N-methylamino-6-methyl-7-anilinofluoran, 3-N-n-propyl-N-methylamino-6-methyl-7-anilinofluoran, 3-N-n-propyl-N-ethylamino-6-methyl-7-anilinofluoran, 3-N-n-butyl-N-methylamino-6-methyl-7-anilinofluoran, 3-N-n-butyl-N-ethylamino-6-methyl-7-anilinofluoran, 3-N-isobutyl-N-methylamino-6-methyl-7-anilinofluoran, 3-N-isobutyl-N-ethylamino-6-methyl-7-anilinofluoran, 3-N-isopentyl-N-ethylamino-6-methyl-7-anilinofluoran, 3-N-n-hexyl-N-methylamino-6-methyl-7-anilinofluoran, 3-N-cyclohexyl-N-ethylamino-6-methyl-7-anilinofluoran, 3-N-cyclohexyl-N-n-propylamino-6-methyl-7-anilinofluoran, 3-N-cyclohexyl-N-n-butylamino-6-methyl-7-anilinofluoran, 3-N-cyclohexyl-N-n-hexylamino-6-methyl-7-anilinofluoran, 3-N-cyclohexyl-N-n-octylamino-6-methyl-7-anilinofluoran, 3-N-(2'-methoxyethyl)-N-methylamino-6-methyl-7-anilinofluoran, 3-N-(2'-methoxyethyl)-N-ethylamino-6-methyl-7-anilinofluoran, 3-N-(2'-methoxyethyl)-N-isobutylamino-6-methyl-7-anilinofluoran, 3-N-(2'-ethoxyethyl)-N-methylamino-6-methyl-7-anilinofluoran, 3-N-(2'-ethoxyethyl)-N-ethylamino-6-methyl-7-anilinofluoran, 3-N-(3'-methoxypropyl)-N-methylamino-6-methyl-7-anilinofluoran, 3-N-(3'methoxypropyl)-N-ethylamino-6-methyl-7-anilinofluoran, 3-N-(3'-ethoxypropyl)-N-methylamino-6-methyl-7-anilinofluoran, 3-N-(3'ethoxypropyl)-N-ethylamino-6-methyl-7-anilinofluoran, 3-N-(2'-tetrahydrofurfuryl)-N-ethylamino-6-methyl-7-anilinofluoran, 3-N-(4'-methylphenyl)-N-ethylamino-6-methyl-7-anilinofluoran, 3-diethylamino-6-ethyl-7-anilinofluoran, 3-diethylamino-6-methyl-7-(3'-methylphenylamino)fluoran, 3-diethylamino-6-methyl-7-(2',6'-dimethylphenylamino)fluoran, 3-di-n-butylamino-6-methyl-7-(2',6'-dimethylphenylamino)fluoran, 3-di-n-butylamino-7-(2',6'-dimethylphenylamino)fluoran, 2,2-bis[4'-(3-N-cyclohexyl-N-methylamino-6-methylfluoran)-7-ylaminophenyl]propane, 3-[4'-(4-phenylaminophenyl)aminophenyl]amino-6-methyl-7-chlorofluoran, and 3-[4'(dimethylaminophenyl)]amino-5,7-dimethylfluoran, phthalides such as 3-(2-methyl-4-diethylaminophenyl)-3-(1-ethyl-2-methylindol-3-yl)-4-azaphthalide, 3-(2-n-propoxycarbonylamino-4-di-n-propylaminophenyl)-3-(1-ethyl-2-methylindol-3-yl)-4-azaphthalide, 3-(2-methylamino-4-di-n-propylaminophenyl)-3-(1-ethyl-2-methylindol-3-yl)-4-azaphthalide, 3-(2-methyl-4-di-n-hexylaminophenyl)-3-(1-n-octyl-2-methylindol-3-yl)-4,7-diazaphthalide, 3,3-bis(2-ethoxy-4-diethylaminophenyl)-4-azaphthalide, 3,3-bis(1-n-octyl-2-methylindol-3-yl)-4-azaphthalide, 3-(2-ethoxy-4-diethylaminophenyl)-3-(1-ethyl-2-methylindol-3-yl)-4-azaphthalide, 3-(2-ethoxy-4-diethylaminophenyl)-3-(1-octyl-2-methylindol-3-yl)-4-azaphthalide, 3-(2-ethoxy-4-diethylaminophenyl)-3-(1-octyl-2-methylindol-3-yl)-7-azaphthalide, 3-(2-ethoxy-4-diethylaminophenyl)-3-(1-ethyl-2-methylindol-3-yl)-4-azaphthalide, 3-(2-ethoxy-4-diethylaminophenyl)-3-(1-ethyl-2-methylindol-3-yl)-7-azaphthalide, 3-(2-hexyloxy-4-diethylaminophenyl)-3-(1-ethyl-2-methylindol-3-yl)-4-azaphthalide, 3-(2-hexyloxy-4-diethylaminophenyl)-3-(1-ethyl-2-methylindol-3-yl)-7-azaphthalide, 3-(2-ethoxy-4-diethylaminophenyl)-3-(1-ethyl-2-phenylindol-3-yl)-4-azaphthalide, 3-(2-ethoxy-4-diethylaminophenyl)-3-(1-ethyl-2-phenylindol-3-yl)-7-azaphthalide, 3-(2-butoxy-4-diethylaminophenyl)-3-(1-ethyl-2-phenylindol-3-yl)-4-azaphthalide, 3-(2-butoxy-4-diethylaminophenyl)-3-(1-ethyl-2-phenylindol-3-yl)-7-azaphthalide, 3-methyl-spiro-dinaphthopyran, 3-ethyl-spiro-dinaphthopyran, 3-phenyl-spiro-dinaphthopyran, 3-benzyl-spiro-dinaphthopyran, 3-methyl-naphtho-(3-methoxybenzo)spiropyran, 3-propyl-spiro-dibenzopyran-3,6-bis(dimethylamino)fluorene-9-spiro-3'-(6'-dimethylamino)phthalide, and 3,6-bis(diethylamino)fluorene-9-spiro-3'-(6'-dimethylamino)phthalide.

Further, other examples thereof include 2-anilino-6'-(N-ethyl-N-isopentyl)amino-3'-methylspiro[isobenzofuran-1(3H),9'-(9H)xanthene]-3-one, 2'-anilino-6'-(N-ethyl-N-(4-methylphenyl))amino-3'-methylspiro[isobenzofuran-1(3H), 9'-(9H)xanthene]-3-one, 3'-N,N-dibenzylamino-6'-N,N-diethylaminospiro[isobenzofuran-1(3H),9'-(9H)xanthene]-3-one, and 2'-(N-methyl-N-phenyl)amino-6'-(N-ethyl-N-(4-methylphenyl))aminospiro[isobenzofuran-1(3H),9'-(9H)xanthene]-3-one.

Among these, from the viewpoint of the color developability, it is preferable that the acid color former used in the present disclosure is at least one compound selected from the group consisting of a spiropyran compound, a spirooxazine compound, a spirolactone compound, and a spirolactam compound.

From the viewpoint of the visibility, it is preferable that the color tone of the coloring agent after color development is green, blue, or black.

As the acid color former, a commercially available product can be used, and examples thereof include ETAC, RED500, RED520, CVL, S-205, BLACK305, BLACK400, BLACK100, BLACK500, H-7001, GREEN300, NIRBLACK78, BLUE220, H-3035, BLUE203, ATP, H-1046, and H-2114 (all manufactured by Fukui Yamada Chemical Co., Ltd.), ORANGE-DCF, Vermilion-DCF, PINK-DCF, RED-DCF, BLMB, CVL, GREEN-DCF, and TH-107 (all manufactured by Hodogaya Chemical Co., Ltd.), ODB, ODB-2, ODB-4, ODB-250, ODB-BlackXV, Blue-63, Blue-502, GN-169, GN-2, Green-118, Red-40, and Red-8 (all manufactured by Yamamoto Chemicals Inc.), and Crystal Violet Lactone (manufactured by Tokyo Chemical Industry Co., Ltd.). Among these commercially available products, ETAC, S-205, BLACK305, BLACK400, BLACK100, BLACK500, H-7001, GREEN300, NIRBLACK78, H-3035, ATP, H-1046, H-2114, GREEN-DCF, Blue-63, GN-169, and Crystal Violet Lactone are preferable from the viewpoint that the visible light absorbance of a film to be formed is satisfactory.

These acid color formers may be used alone or in combination of two or more kinds thereof.

The content of the acid color former is preferably in a range of 0.5% by mass to 10% by mass and more preferably in a range of 1% by mass to 5% by mass with respect to the total mass of the image recording layer.

—Chain Transfer Agent—

The image recording layer used in the present disclosure may contain a chain transfer agent. The chain transfer agent contributes to improvement of the printing durability of the planographic printing plate.

As the chain transfer agent, a thiol compound is preferable, a thiol having 7 or more carbon atoms is more preferable from the viewpoint of the boiling point (difficulty in volatilization), and a compound containing a mercapto group on an aromatic ring (aromatic thiol compound) is still more preferable. It is preferable that the thiol compound is a monofunctional thiol compound.

Specific examples of the chain transfer agent include the following compounds.

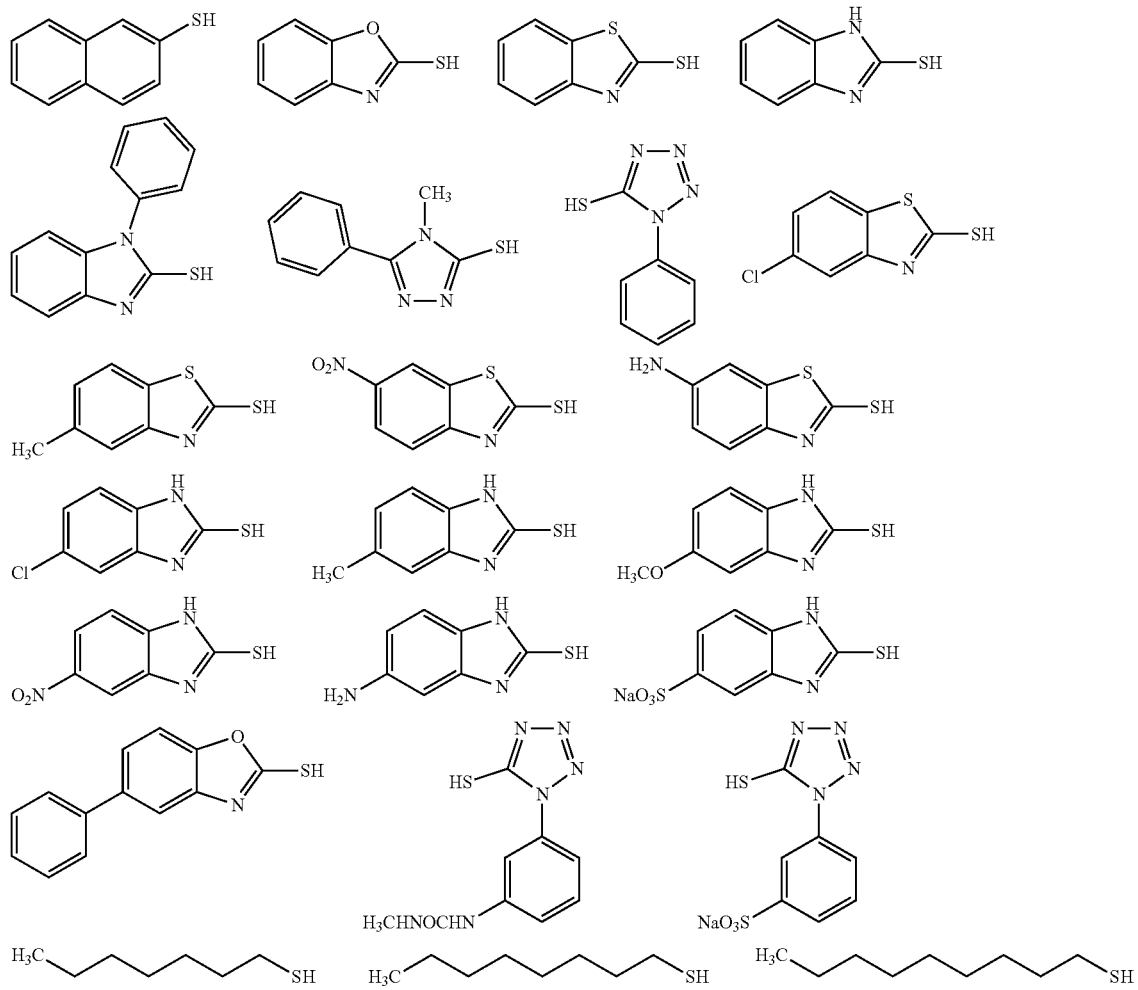

-continued

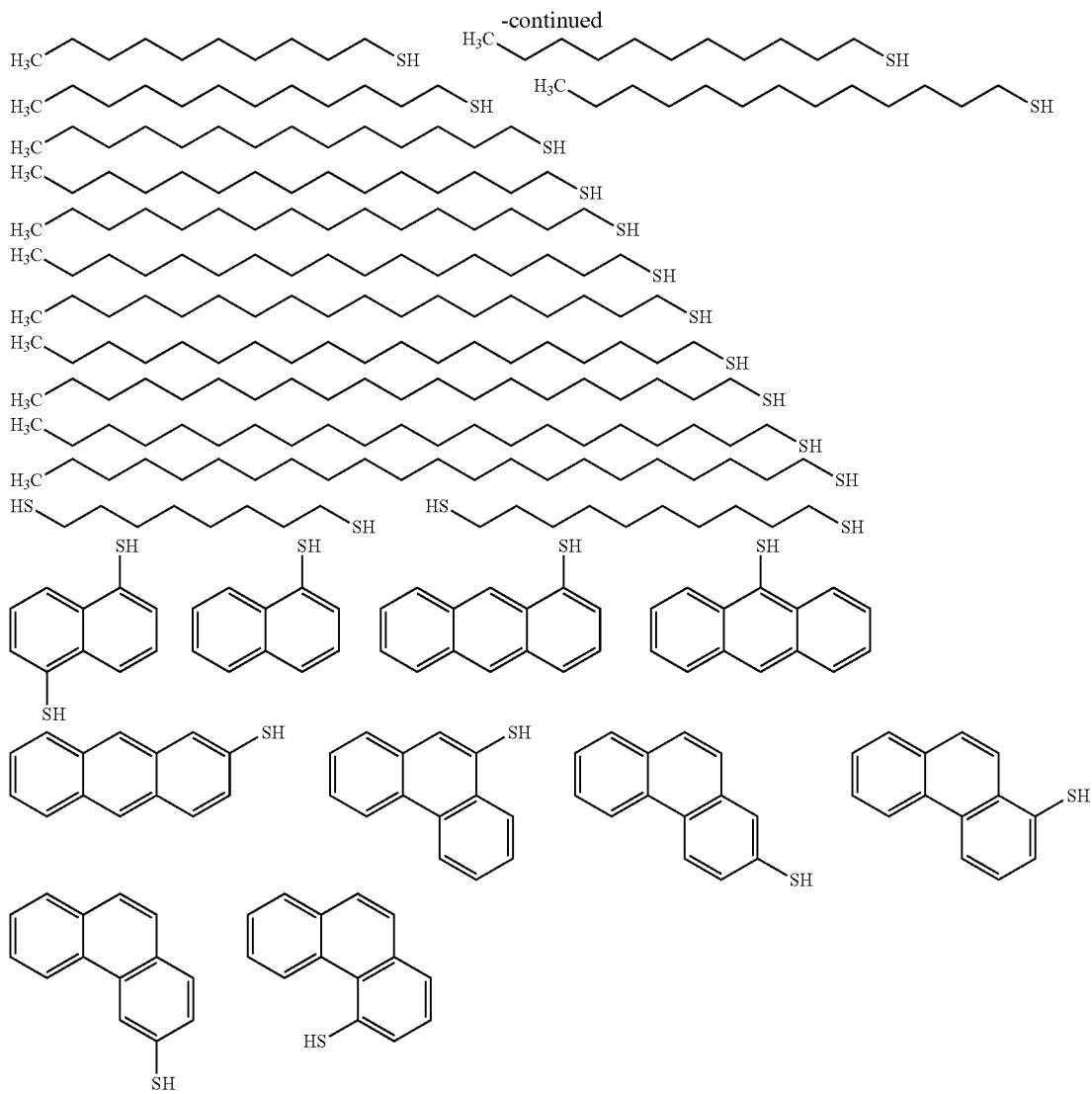

The chain transfer agent may be used alone or in combination of two or more kinds thereof.

The content of the chain transfer agent is preferably in a range of 0.01% by mass to 50% by mass, more preferably in a range of 0.05% by mass to 40% by mass, and still more preferably in a range of 0.1% by mass to 30% by mass with respect to total mass of the image recording layer.

—Low-Molecular-Weight Hydrophilic Compound—

In order to improve the on-press developability while suppressing degradation of the printing durability, the image recording layer may contain a low-molecular-weight hydrophilic compound. As the low-molecular-weight hydrophilic compound, a compound having a molecular weight of less than 1000 is preferable, a compound having a molecular weight of less than 800 is more preferable, and a compound having a molecular weight of less than 500 is still more preferable.

As the low-molecular-weight hydrophilic compound, examples of a water-soluble organic compound include glycols such as ethylene glycol, diethylene glycol, triethylene glycol, propylene glycol, dipropylene glycol, and tripropylene glycol and ether or ester derivatives thereof; polyols such as glycerin, pentaerythritol, and tris(2-hydroxyethyl) isocyanurate; organic amines such as triethanolamine, diethanolamine, and monoethanolamine and salts thereof; organic sulfonic acids such as alkylsulfonic acid, toluenesulfonic acid, and benzenesulfonic acid and salts thereof; organic sulfamic acids such as alkyl sulfamic acid and salts thereof; organic sulfuric acids such as alkyl sulfuric acid and alkyl ether sulfuric acid and salts thereof; organic phosphonic acids such as phenyl phosphonic acid and salts thereof; organic carboxylic acids such as tartaric acid, oxalic acid, citric acid, malic acid, lactic acid, gluconic acid, and amino acids and salts thereof; and betaines.

Among these, it is preferable that the low-molecular-weight hydrophilic compound contains at least one selected from polyols, organic sulfates, organic sulfonates, and betaines.

Specific examples of the organic sulfonates include an alkyl sulfonate such as sodium n-butyl sulfonate, sodium n-hexyl sulfonate, sodium 2-ethylhexyl sulfonate, sodium cyclohexyl sulfonate, or sodium n-octyl sulfonate; an alkyl sulfonate containing an ethylene oxide chain such as sodium 5,8,11-trioxapentadecane-1-sulfonate, sodium 5,8,11-trioxaheptadecane-1-sulfonate, sodium 13-ethyl-5,8,11-trioxaheptadecane-1-sulfonate, or sodium 5,8,11,14-tetraoxatetradecosane-1-sulfonate; an aryl sulfonate such as sodium benzene sulfonate, sodium p-toluene sulfonate, sodium p-hydroxybenzene sulfonate, sodium p-styrene sulfonate, sodium isophthalic acid dimethyl-5-sulfonate, sodium 1-naphthyl sulfonate, sodium 4-hydroxynaphthyl sulfonate, disodium 1,5-naphthalene disulfonate, or trisodium 1,3,6-naphthalene trisulfonate; and compounds described in paragraphs 0026 to 0031 of JP2007-276454A and paragraphs 0020 to 0047 of JP2009-154525A. The salt may be potassium salt or lithium salt.

Examples of the organic sulfates include an alkyl, an alkenyl, an alkynyl, and an aryl of polyethylene oxide and a sulfate of heterocyclic monoether. The number of ethylene oxide units is preferably in a range of 1 to 4. As a salt, a sodium salt, a potassium salt, or a lithium salt is preferable. Specific examples thereof include compounds described in paragraphs 0034 to 0038 of JP2007-276454A.

As betaines, compounds having 1 to 5 carbon atoms of hydrocarbon substituents to nitrogen atoms are preferable. Specific examples thereof include trimethyl ammonium acetate, dimethyl propyl ammonium acetate, 3-hydroxy-4-trimethyl ammonio butyrate, 4-(1-pyridinio)butyrate, 1-hydroxyethyl-1-imidazolioacetate, trimethyl ammonium methane sulfonate, dimethyl propyl ammonium methane sulfonate, 3-trimethylammonio-1-propane sulfonate, and 3-(1-pyridinio)-1-propane sulfonate.

Since the low-molecular-weight hydrophilic compound has a small structure of a hydrophobic portion and does not almost exhibit a surfactant action, the hydrophobicity or coated-film hardness of an image area is not degraded by dampening water permeating into an exposed portion (image area) of the image recording layer and the ink receiving property or printing durability of the image recording layer can be maintained satisfactorily.

The content of the low-molecular-weight hydrophilic compounds is preferably in a range of 0.5% by mass to 20% by mass, more preferably in a range of 1% by mass to 15% by mass, and still more preferably in a range of 2% by mass to 10% by mass with respect to the total mass of the image recording layer. In a case where the content thereof is in the above-described range, excellent on-press developability and printing durability can be obtained.

The low-molecular-weight hydrophilic compounds may be used alone or in mixture of two or more kinds thereof.

—Sensitizing Agent—

In order to improve the impressing property, the image recording layer may contain a sensitizing agent such as a phosphonium compound, a nitrogen-containing low-molecular-weight compound, or an ammonium group-containing polymer. Particularly, in a case where a protective layer contains an inorganic layered compound, these compounds function as a surface coating agent of the inorganic layered compound and suppress degradation of the impressing property due to the inorganic layered compound during the printing.

As the sensitizing agent, it is preferable that a phosphonium compound, a nitrogen-containing low-molecular-weight compound, and an ammonium group-containing polymer are used in combination and more preferable that a phosphonium compound, quaternary ammonium salts, and an ammonium group-containing polymer are used in combination.

Examples of the phosphonium compound include phosphonium compounds described in JP2006-297907A and JP2007-50660A. Specific examples thereof include tetrabutyl phosphonium iodide, butyl triphenyl phosphonium bromide, tetraphenyl phosphonium bromide, 1,4-bis(triphenylphosphonio)butane=di(hexafluorophosphate), 1,7-bis(triphenylphosphonio)heptane=sulfate, and 1,9-bis(triphenylphosphonio)nonane=naphthalene-2,7-disulfonate.

Examples of the nitrogen-containing low-molecular-weight compound include amine salts and quaternary ammonium salts. Further, examples thereof include imidazolinium salts, benzimidazolinium salts, pyridinium salts, and quinolinium salts. Among these, quaternary ammonium salts and pyridinium salts are preferable. Specific examples thereof include tetramethyl ammonium=hexa-fluorophosphate, tetrabutylammonium=hexafluorophosphate, dodecyltrimethylammonium=p-toluene sulfonate, benzyltriethylammonium=hexafluorophosphate, benzyldimethyloctylammonium=hexafluorophosphate, benzyldimethyldodecylammonium=hexafluorophosphate, and compounds described in paragraphs 0021 to 0037 of JP2008-284858A and paragraphs 0030 to 0057 of JP2009-90645A.

The ammonium group-containing polymer is not limited as long as the polymer contains an ammonium group in the structure thereof, but a polymer that contains, as a copolymerization component, 5% by mole to 80% by mole of (meth)acrylate containing an ammonium group in a side chain is preferable. Specific examples thereof include polymers described in paragraphs 0089 to 0105 of JP2009-208458A.

The reduced specific viscosity (unit: ml/g) of the ammonium salt-containing polymer which is acquired by the measuring method described in JP2009-208458A is preferably in a range of 5 to 120, more preferably in a range of 10 to 110, and particularly preferably in a range of 15 to 100. In a case where the reduced specific viscosity is converted to the weight-average molecular weight (Mw), the value thereof is preferably in a range of 10000 to 150000, more preferably in a range of 17000 to 140000, and particularly preferably in a range of 20000 to 130000.

Hereinafter, specific examples of the ammonium group-containing polymer will be described.

(1) A 2-(trimethylammonio)ethylmethacrylate=p-toluenesulfonate/3,6-dioxaheptylmethacrylate copolymer (molar ratio of 10/90, Mw of 45000);

(2) A 2-(trimethylammonio)ethylmethacrylate=hexafluorophosphate/3,6-dioxaheptylmethacrylate copolymer (molar ratio of 20/80, Mw of 60000);

(3) A 2-(ethyldimethylammonio)ethylmethacrylate=p-toluenesulfonate/hexylmethacrylate copolymer (molar ratio of 30/70, Mw of 45000);

(4) A 2-(trimethylammonio)ethylmethacrylate=hexafluorophosphate/2-ethylhexylmethacrylate copolymer (molar ratio of 20/80, Mw of 60000);

(5) A 2-(trimethylammonio)ethylmethacrylate=methylsulfate/hexylmethacrylate copolymer (molar ratio of 40/60, Mw of 70000);

(6) A 2-(butyldimethylammonio)ethylmethacrylate=hexafluorophosphate/3,6-dioxaheptylmethacrylate copolymer (molar ratio of 25/75, Mw of 65000);

(7) A 2-(butyldimethylammonio)ethylacrylate=hexafluorophosphate/3,6-dioxaheptylmethacrylate copolymer (molar ratio of 20/80, Mw of 65000);

(8) A 2-(butyldimethylammonio)ethylmethacrylate=13-ethyl-5,8,11-trioxa-1-heptadecanesulfonate/3,6-dioxaheptylmethacrylate copolymer (molar ratio of 20/80, Mw of 75000); and (9) A 2-(butyldimethylammonio)ethylmethacrylate=hexafluorophosphate/3,6-dioxaheptylmethacrylate/2-hydroxy-3-methacryloxypropylmethacrylate copolymer (molar ratio of 15/80/5, Mw of 65000).

The content of the sensitizing agent is preferably in a range of 0.01% by mass to 30.0% by mass, more preferably in a range of 0.1% by mass to 15.0% by mass, and still more preferably in a range of 1% by mass to 10% by mass with respect to the total mass of the image recording layer.

—Other Components—

The image recording layer may contain, as other components, a surfactant, a polymerization inhibitor, a higher fatty acid derivative, a plasticizer, an inorganic particle, an inorganic layered compound, and the like. Specifically, the description in paragraphs 0114 to 0159 of JP2008-284817A can be referred to.

—Formation of Image Recording Layer—

The image recording layer of the planographic printing plate precursor according to the embodiment of the present disclosure can be formed by dispersing or dissolving each of the above-described required components in a known solvent to prepare a coating solution, coating a support with the coating solution using a known method such as a bar coater coating method, and drying the coating solution, as described in paragraphs 0142 and 0143 of JP2008-195018A. The coating amount (solid content) of the image recording layer after the coating and the drying varies depending on the applications thereof, but is preferably in a range of 0.3 g/m² to 3.0 g/m². In a case where the coating amount thereof is in the above-described range, excellent sensitivity and excellent film-coating characteristics of the image recording layer are obtained.

As the solvent, a known solvent can be used. Specific examples thereof include water, acetone, methyl ethyl ketone (2-butanone), cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 1-methoxy-2-propanol, 3-methoxy-1-propanol, methoxy methoxy ethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethylsulfoxide, γ-butyrolactone, methyl lactate, and ethyl lactate. The solvent may be used alone or in combination of two or more kinds thereof. The concentration of solid contents in the coating solution is preferably in a range of 1% by mass to 50% by mass.

The coating amount (solid content) of the image recording layer after the coating and the drying varies depending on the applications thereof, but from the viewpoints of satisfactory sensitivity and satisfactory film characteristics of the image recording layer, the coating amount thereof is preferably in a range of 0.3 to 3.0 g/m².

<Support>

The support in the planographic printing plate precursor according to the embodiment of the present disclosure can be appropriately selected from known hydrophilic supports for planographic printing plate precursors. Preferred examples of the support include a hydrophilic support. As the hydrophilic support, an aluminum plate which has been subjected to a roughening treatment and an anodization treatment according to known methods is preferable.

The aluminum plate may be further subjected to a treatment appropriately selected from an expansion treatment or a sealing treatment of micropores of an anodized film described in JP2001-253181A or JP2001-322365A; a surface hydrophilization treatment using alkali metal silicate described in U.S. Pat. Nos. 2,714,066A, 3,181,461A, 3,280,734A, and 3,902,734A; or a surface hydrophilization treatment using polyvinyl phosphonic acid described in U.S. Pat. Nos. 3,276,868A, 4,153,461A, and 4,689,272A as necessary.

The center line average roughness of the support is preferably in a range of 0.10 μm to 1.2 μm.

The support may have a back coat layer containing an organic polymer compound described in JP1993-45885A (JP-H05-45885A)) or an alkoxy compound of silicon described in JP1994-35174A (JP-H06-35174A) on the surface opposite to a side where the image recording layer is provided, as necessary.

<Undercoat Layer>

It is preferable that the planographic printing plate precursor according to the embodiment of the present disclosure includes an undercoat layer (also referred to as an interlayer) between the image recording layer and the support. Since adhesion of the support to the image recording layer is stronger in an exposed portion and the image recording layer is easily peeled off from the support in an unexposed portion, the undercoat layer contributes to improvement of the developability without degrading the printing durability. Further, in a case of infrared laser exposure, since the undercoat layer functions as a heat insulating layer, the undercoat layer also has an effect of preventing heat generated by exposure from being diffused in the support, and thus the sensitivity is not degraded.

Examples of the compound used for the undercoat layer include a polymer containing an adsorptive group which can be adsorbed on the surface of the support and a hydrophilic group. A polymer which contains an adsorptive group and a hydrophilic group for the purpose of improving the adhesiveness to the image recording layer and further contains a crosslinkable group is preferable. The compound used for the undercoat layer may be a low-molecular-weight compound or a polymer. The compound used for the undercoat layer may be used in the form of a mixture of two or more kinds thereof as necessary.

In a case where the compound used for the undercoat layer is a polymer, a copolymer of a monomer containing an adsorptive group, a monomer containing a hydrophilic group, and a monomer containing a crosslinkable group is preferable.

Preferred examples of the adsorptive group that can be adsorbed on the surface of the support include a phenolic hydroxy group, a carboxy group, $-PO_3H_2$, $-OPO_3H_2$, $-CONHSO_2-$, $-SO_2NHSO_2-$, and $-COCH_2COCH_3$. As the hydrophilic group, a sulfo group or a salt thereof, or a salt of a carboxy group is preferable. As the crosslinkable group, an acrylic group, a methacrylic group, an acrylamide group, a methacrylamide group, or an allyl group is preferable.

The polymer may contain a crosslinkable group introduced by forming salts between a polar substituent of the polymer and a compound that has a substituent having the opposite charge to the polar substituent and an ethylenically unsaturated bond or may be formed by further copolymerization of monomers other than the monomers described above and preferably hydrophilic monomers.

Specifically, a silane coupling agent having an ethylenic double bond reactive group, which can be addition-polymerized, described in JP1998-282679A (JP-H10-282679A); and a phosphorous compound having an ethylenic double bond reactive group described in JP1990-304441A (JP-H02-304441A) are suitably exemplified. Further, crosslinkable groups (preferably ethylenically unsaturated bond groups) described in JP2005-238816A, JP2005-125749A, JP2006-239867A, and JP2006-215263A, and low-molecular-weight or high-molecular-weight compounds containing functional groups and hydrophilic groups that interact with the surface of a support are preferably used.

More preferred examples thereof include high-molecular-weight polymers containing adsorptive groups which can be adsorbed on the surface of a support, hydrophilic groups, and crosslinkable groups described in JP2005-125749A and JP2006-188038A.

The content of the ethylenically unsaturated bond group in the polymer used for the undercoat layer is preferably in a range of 0.1 mmol to 10.0 mmol and more preferably in a range of 0.2 mmol to 5.5 mmol with respect to 1 g of the polymer.

The weight-average molecular weight (Mw) of the polymer used for the undercoat layer is preferably 5000 or greater and more preferably in a range of 10000 to 300000.

For the purpose of preventing stain over time, the undercoat layer may contain a chelating agent, a secondary or tertiary amine, a polymerization inhibitor, a compound that includes an amino group or a functional group having polymerization inhibiting ability and a group interacting with the surface of a support (for example, 1,4-diazabicyclo [2.2.2]octane (DABCO), 2,3,5,6-tetrahydroxy-p-quinone, chloranil, sulfophthalic acid, hydroxyethyl ethylene diamine triacetic acid, dihydroxyethyl ethylene diamine diacetic acid, or hydroxyethyl imino diacetic acid) in addition to the compounds for an undercoat layer described above.

The undercoat layer is applied according to a known method. The coating amount (solid content) of the undercoat layer is preferably in a range of 0.1 mg/m$^2$ to 100 mg/m$^2$ and more preferably in a range of 1 mg/m$^2$ to 30 mg/m$^2$.

<Protective Layer>

It is preferable that the planographic printing plate precursor according to the embodiment of the present disclosure has a protective layer (also referred to as an overcoat layer) on the image recording layer. The protective layer has a function of suppressing a reaction of inhibiting image formation through oxygen blocking, a function of preventing generation of damage to the image recording layer, and a function of preventing ablation in a case of exposure to a high illuminance laser.

Such a protective layer having the above-described characteristics is described in U.S. Pat. No. 3,458,311A and JP1980-49729B (JP-S55-49729B). As a polymer with low oxygen permeability which is used for a protective layer, any of a water-soluble polymer and a water-insoluble polymer is appropriately selected and then used and two or more kinds thereof can be used in the form of a mixture as necessary. Specific examples thereof include polyvinyl alcohol, modified polyvinyl alcohol, polyvinylpyrrolidone, a water-soluble cellulose derivative, and poly(meth)acrylonitrile.

As the modified polyvinyl alcohol, acid-modified polyvinyl alcohol containing a carboxy group or a sulfo group is preferably used. Specific examples thereof include modified polyvinyl alcohol described in JP2005-250216A and JP2006-259137A.

It is preferable that the protective layer contains an inorganic layered compound in order to improve the oxygen-blocking property. The inorganic layered compound indicates a particle having a thin tabular shape, and examples thereof include a mica group such as natural mica and synthetic mica, talc represented by Formula: 3MgO·4SiO·H$_2$O, teniolite, montmorillonite, saponite, hectorite, and zirconium phosphate.

An inorganic layered compound which has been preferably used is a mica compound. Examples of the mica compound include a mica group such as synthetic mica and natural mica represented by Formula: A(B,C)$_{2-5}$D$_4$O$_{10}$(OH, F,O)$_2$ [here, A represents any of K, Na, or Ca, B and C represent any of Fe (II), Fe (III), Mn, Al, Mg, or V, and D represents Si or Al].

In the mica group, examples of the natural mica include muscovite, soda mica, phlogopite, biotite, and lepidolite. Examples of the synthetic mica include non-swellable mica such as fluorophogopite KMg$_3$(AlSi$_3$O$_{10}$)F$_2$ or potassium tetrasilicic mica KMg$_{2.5}$Si$_4$O$_{10}$)F$_2$; and swellable mica such as Na tetrasilicic mica NaMg$_{2.5}$(Si$_4$O$_{10}$)F$_2$, Na or Li teniolite (Na,Li)Mg$_2$Li(Si$_4$O$_{10}$)F$_2$, or montmorillonite-based Na or Li hectorite (Na,Li)$_{1/8}$Mg$_{2/5}$Li$_{1/8}$(Si$_4$O$_{10}$)F$_2$. Further, synthetic smectite is also useful.

Among the above-described mica compounds, fluorine-based swellable mica is particularly useful. In other words, swellable synthetic mica has a laminated structure formed of unit crystal lattice layers having a thickness of 10 Å to 15 Å (1 Å=0.1 nm), and substitution of metal atoms in the lattice is significantly larger than that in other clay minerals. As the result, the lattice layers causes shortage of a positive charge. In order to compensate for this, cations such as Li$^+$, Na$^+$, Ca$^{2+}$, and Mg$^{2+}$ are adsorbed between layers. Cations interposed between layers are referred to as exchangeable cations and can be exchanged for various cations. Particularly, in a case where interlayer cations are Li$^+$ and Na$^+$, since the ion radii thereof is small, bonds between layered crystal lattices are weak and largely swollen due to water. In a case where shearing is applied in this state, cleavage easily occurs so that a sol stabilized in water is formed. The swellable synthetic mica has such a strong tendency and is particularly preferably used.

As the shape of the mica compound, from the viewpoint of controlling diffusion, it is preferable that the thickness thereof is as small as possible and the plane size thereof is as large as possible within a range where the smoothness of the coating surface or the permeability of actinic rays is not inhibited. Therefore, the aspect ratio thereof is preferably 20 or greater, more preferably 100 or greater, and particularly preferably 200 or greater. The aspect ratio is a ratio of the major diameter to the thickness of a particle and can be measured using, for example, a projection drawing obtained from a microphotograph of particles. The effects to be obtained increase as the aspect ratio increases.

In the particle diameter of the mica compound, the average major diameter thereof is preferably in a range of 0.3 μm to 20 μm, more preferably in a range of 0.5 μm to 10 μm, and particularly preferably in a range of 1 μm to 5 μm. The average thickness of the particles is preferably 0.1 μm or less, more preferably 0.05 μm or less, and particularly preferably 0.01 μm or less. Specifically, for example, as a preferable embodiment of swellable synthetic mica which is a representative compound, the thickness thereof is in a range of 1 nm to 50 nm and the surface size (major diameter) is in a range of 1 μm to 20 μm.

The content of the inorganic layered compound is preferably in a range of 1% by mass to 60% by mass and more preferably in a range of 3% by mass to 50% by mass with respect to the total solid content of the protective layer. In a case where a plurality of kinds of inorganic layered compounds are used in combination, it is preferable that the total amount of the inorganic layered compounds is the content described above. In a case where the content thereof is in the above-described range, the oxygen-blocking property is improved and satisfactory sensitivity is obtained. Further, degradation of the impressing property can be prevented.

The protective layer may contain known additives such as a plasticizer for imparting flexibility, a surfactant for improving the coating properties, and an inorganic particle for controlling the slipperiness of the surface. Further, the protective layer may contain a sensitizing agent described in the section of the image recording layer.

The protective layer is coated according to a known method. The coating amount (solid content) of the protective layer is preferably in a range of 0.01 g/m$^2$ to 10 g/m$^2$, more preferably in a range of 0.02 g/m$^2$ to 3 g/m$^2$, and particularly preferably in a range of 0.02 g/m$^2$ to 1 g/m$^2$.

(Method of Preparing Planographic Printing Plate and Planographic Printing Method)

A planographic printing plate can be prepared by image-exposing the planographic printing plate precursor according to the embodiment of the present disclosure and performing a development treatment thereon.

It is preferable that the method of preparing a planographic printing plate according to the embodiment of the present disclosure includes a step of imagewise-exposing the planographic printing plate precursor according to the embodiment of the present disclosure (hereinafter, also referred to as an "exposure step"), and a step of supplying at least one selected from the group consisting of printing ink and dampening water to remove the image recording layer of the non-image area on the printing press (hereinafter, also referred to as an "on-press development step").

It is preferable that the planographic printing method according to the embodiment of the present disclosure includes a step of imagewise-exposing the planographic printing plate precursor according to the embodiment of the present disclosure (an exposure step), a step of supplying at least one selected from the group consisting of printing ink and dampening water to remove the image recording layer of the non-image area on the printing press and preparing a planographic printing plate (an on-press development step), and a step of performing printing using the obtained planographic printing plate (a printing step).

Hereinafter, preferred embodiments of each step of the method of preparing a planographic printing plate according to embodiment of the present disclosure and each step of the planographic printing method according to the embodiment of the present disclosure will be sequentially described. Further, the planographic printing plate precursor according to the embodiment of the present disclosure can also be developed with a developer.

Hereinafter, the exposure step and the on-press development step in the method of preparing a planographic printing plate will be described, and the exposure step in the method of preparing a planographic printing plate according to the embodiment of the present disclosure is the same as the exposure step in the planographic printing method according to the embodiment of the present disclosure, and the on-press development step in the method of preparing a planographic printing plate according to the embodiment of the present disclosure is the same as the on-press development step in the planographic printing method according to the embodiment of the present disclosure.

<Exposure Step>

It is preferable that the method of preparing a planographic printing plate according to the embodiment of the present disclosure includes an exposure step of imagewise-exposing the planographic printing plate precursor according to the embodiment of the present disclosure to form an exposed portion and an unexposed portion. It is preferable that the planographic printing plate precursor according to the embodiment of the present disclosure is exposed to a laser through a transparent original picture having a line image, a halftone image, and the like or imagewise-exposed by laser beam scanning using digital data.

Alight source having a wavelength of 750 nm to 1400 nm is preferably used. As the light source having a wavelength of 750 nm to 1400 nm, a solid-state laser or a semiconductor laser that radiates infrared rays is suitable. The output of the infrared laser is preferably 100 mW or greater, the exposure time per one pixel is preferably shorter than 20 microseconds, and the irradiation energy quantity is preferably in a range of 10 mJ/cm$^2$ to 300 mJ/cm$^2$. For the purpose of reducing the exposure time, it is preferable to use a multi-beam laser device. The exposure mechanism may be any of an internal drum system, an external drum system, or a flat bed system.

The image exposure can be performed using a plate setter according to a usual method. In a case of the on-press development, the planographic printing plate precursor may be mounted on the printing press and then imagewise-exposed on the printing press.

<On-Press Development Step>

It is preferable that the method of preparing a planographic printing plate according to the embodiment of the present disclosure includes an on-press development step of supplying at least one selected from the group consisting of printing ink and dampening water to remove the image recording layer of the non-image area on the printing press.

Hereinafter, the on-press development method will be described.

[On-Press Development Method]

According to the on-press development method, it is preferable that the planographic printing plate is prepared from the image-exposed planographic printing plate precursor by supplying oil-based ink and an aqueous component on the printing press to remove the image recording layer of the non-image area.

That is, in a case where the planographic printing plate precursor is image-exposed and then mounted on the printing press without performing any development treatment thereon or the planographic printing plate precursor is mounted on the printing press, image-exposed on the printing press, and oil-based ink and an aqueous component are supplied to perform printing, the uncured image recording layer is removed by being dissolved or dispersed by any or both the supplied oil-based ink and aqueous component in the non-image area at an initial state of the printing so that the hydrophilic surface is exposed to the portion thereof. Meanwhile, the image recording layer cured by exposure forms an oil-based ink receiving unit having a lipophilic surface in the exposed portion. The oil-based ink or the aqueous component may be initially supplied to the plate surface, but it is preferable that the oil-based ink is initially supplied from the viewpoint of preventing contamination of the aqueous component due to the component of the removed image recording layer. In this manner, the planographic printing plate precursor is on-press developed on the printing press and used as it is for printing a plurality of sheets. As the oil-based ink and the aqueous component, printing ink and dampening water for typical planographic printing are suitably used.

As the laser for image-exposing the planographic printing plate precursor according to the embodiment of the present disclosure, a light source having a wavelength of 300 nm to 450 nm or 750 nm to 1400 nm is preferably used. A planographic printing plate precursor containing, in the image recording layer, a sensitizing dye that has an absorption maximum in this wavelength range is preferably used as the light source having a wavelength of 300 nm to 450 nm, and those described above are preferably used as the light source having a wavelength of 750 nm to 1400 nm. A semiconductor laser is suitable as the light source having a wavelength of 300 nm to 450 nm.

<Developer Development Step>

The method of preparing a planographic printing plate according to the embodiment of the present disclosure may be a method including a step of imagewise-exposing the planographic printing plate precursor according to the embodiment of the present disclosure, and a step of removing the image recording layer of the non-image area with a developer to prepare a planographic printing plate (also referred to as a "developer development step").

Further, the planographic printing method according to the embodiment of the present disclosure may be a method including a step of imagewise-exposing the planographic printing plate precursor according to the embodiment of the present disclosure, a step of removing the image recording layer of the non-image area with a developer to prepare a planographic printing plate, and a step of performing printing using the obtained planographic printing plate.

As the developer, a known developer can be used.

The pH of the developer is not particularly limited and a strong alkaline developer may be used, but a developer having a pH of 2 to 11 is preferable. Preferred examples of the developer having a pH of 2 to 11 include a developer containing at least one of a surfactant or a water-soluble polymer compound.

As the method for the development treatment using a strong alkaline developer, a method of removing a protective layer by carrying out the pre-water washing step, performing alkali development, removing the alkali with water by carrying out the post-water washing step, performing a gum liquid treatment, and performing drying by carrying out a drying step may be employed.

Further, in a case where the developer containing a surfactant or a water-soluble polymer compound is used, the development and the gum liquid treatment can be performed at the same time. Accordingly, the post-water washing step is not particularly necessary, and the drying step can be performed after the development and the gum liquid treatment carried out using one liquid. Further, since the removal of the protective layer can be carried out simultaneously with the development and the gum liquid treatment, the pre-water washing step is not particularly necessary. After the development treatment, it is preferable that the drying is performed after the excessive developer is removed using a squeeze roller.

<Printing Step>

The planographic printing method according to the embodiment of the present disclosure includes a printing step of supplying printing ink to the planographic printing plate and performing printing with a recording medium.

The printing ink is not particularly limited, and various known inks can be used as desired. Further, preferred examples of the printing ink include oil-based ink and ultraviolet curable ink (UV ink).

In the printing step, dampening water may be supplied as necessary.

Further, the printing step may be performed continuously with the on-press development step or the developer development step without stopping the printing press.

The recording medium is not particularly limited, and a known recording medium can be used as desired.

In the method of preparing a planographic printing plate from the planographic printing plate precursor according to the embodiment of the present disclosure and the planographic printing method according to the embodiment of the present disclosure, the entire surface of the planographic printing plate precursor may be heated before the exposure, during the exposure, and between the exposure and the development as necessary. In a case where the surface is heated in the above-described manner, there is an advantage that the image forming reaction in the image recording layer is promoted, the sensitivity and the printing durability are improved, and the sensitivity is stabilized. In a case where the surface is heated before the development, it is preferable that the heating is performed under a mild temperature condition of 150° C. or lower. In this manner, problems of curing the non-image area and the like can be prevented. In a case where the surface is heated after the development, it is preferable that the heating is performed under an extremely high temperature condition of 100° C. to 500° C. In a case where the temperature is in the above-described range, a sufficient image strengthening effect can be obtained, and problems such as deterioration of the support and thermal decomposition of the image area can be suppressed.

EXAMPLES

Hereinafter, the present disclosure will be described in detail with reference to examples, but the present disclosure is not limited thereto. In the present examples, "%" and "part" respectively indicate "% by mass" and "part by mass" unless otherwise specified. Further, in a polymer compound, the molecular weight indicates the weight-average molecular weight (Mw) and the proportion of repeating constitutional units indicates mole percentage unless otherwise specified. Further, the weight-average molecular weight (Mw) is a value in terms of polystyrene obtained by performing measurement using gel permeation chromatography (GPC). Further, the average particle diameter indicates a volume average particle diameter unless otherwise specified.

<Synthesis of Particle P-1>

430 parts of ion exchange water was added to a three-neck flask, stirred in a nitrogen atmosphere, and heated to 70° C. Next, while 28.0 parts of a compound C-1, 21.0 parts of a compound C-3, and 7.0 parts of a compound D-1 (n=90) were sufficiently mixed and stirred, an aqueous solution consisting of 7.0 parts of a compound A-1, 7.0 parts of a compound B-1, 1.4 parts of potassium persulfate (KPS), and 200 parts of ion exchange water was added thereto, thereby preparing an emulsion. The obtained emulsion was added dropwise to the three-neck flask for 2 hours, and the solution was heated to 95° C. and further heated and stirred for 4 hours.

The reaction solution was allowed to be naturally cooled to room temperature (25° C.), thereby obtaining a dispersion liquid of particle p-1 (concentration of solid contents: 10% by mass). The average particle diameter of the particle p-1 was 103 nm.

<Synthesis of Resin Particle P-2>

100 mL of isopropanol, 90 mL of distilled water, 2.0 parts of a compound A-2, 1.5 parts of a compound B-2, 6.0 parts of a compound C-3, and 0.5 parts of a compound D-2 were added to a three-neck flask and heated to 70° C. in a nitrogen atmosphere. Next, 0.3 part of an initiator V-601 (dimethyl azobis(isobutyrate), manufactured by FUJIFILM Wako Pure Chemical Corporation) was added thereto, and the mixture was heated and stirred for 3 hours, further heated to 90° C., and allowed to react for 4 hours. The reaction solution was allowed to be naturally cooled to room temperature (25° C.), thereby obtaining a dispersion liquid of particle p-2 (concentration of solid contents: 10% by mass). The average particle diameter of the particle p-2 was 121 nm.

<Synthesis of Resin Particle P-3>

20 parts of ion exchange water, 0.3 parts of Rongalit, 0.01 parts of disodium ethylenediamine tetraacetate, and 0.0025 parts of a ferrous sulfate heptahydrate were added to a three-neck flask, and the mixture was stirred at 60° C. and 250 rpm (revolutions per minute) in a nitrogen atmosphere.

Next, 3.0 parts of a compound A-3, 6.0 parts of a compound B-3, 11.0 parts of a compound C-1, 0.75 parts of sodium dodecylbenzene sulfonate, 0.58 parts of a peroxide polymerization initiator (trade name: PERBUTYL H, manufactured by NOF Corporation), and 17 parts of ion exchange water were added thereto, and the mixture was stirred at room temperature for 30 minutes, thereby preparing an emulsion. After 25% by mass of the obtained emulsion was added to the three-neck flask for 30 minutes, the mixture was continuously heated and stirred for 30 minutes, and the remaining 75% by mass of the emulsion was added dropwise thereto for 2 hours. After the completion of dropwise addition, the mixture was heated and stirred for 2 hours. The reaction solution was allowed to be naturally cooled to room temperature (25° C.), thereby obtaining a dispersion liquid of particle p-3 (concentration of solid contents: 35% by mass). The average particle diameter of the particle p-3 was 207 nm.

<Synthesis of Resin Particle P-4>

Particle p-4 was prepared in the same manner as that for the synthesis of the particle p-1 except that the monomers used were changed as listed in Table 1.

<Synthesis of Resin Particle P-5>

Particle p-5 was prepared in the same manner as that for the synthesis of the particle p-3 except that the monomers used were changed as listed in Table 1 and the surfactant was not used.

<Synthesis of Particle P-6>

—Synthesis of Pre-Coated Particle p-6'—

Particle p-6' was prepared in the same manner as that for the synthesis of the particle p-4 except that the monomers used were changed as listed in Table 1 and an anionic surfactant (trade name: PERSOFT (registered trademark) EP, manufactured by NOF Corporation) was used as the surfactant in place of the sodium dodecylbenzene sulfonate. The concentration of solid contents of the particle p-6' in the dispersion liquid was 35% by mass, and the average particle diameter of the particle p-6' was 120 nm.

—Synthesis of Epoxy Polymer E-2—

57.5 parts of 1-methoxy-2-propanol and 25.0 parts of PME-4000 (methoxypolyethylene glycol methacrylate (n=approximately 9), manufactured by NOF Corporation) were added to a three-neck flask, heated to 80° C. in a nitrogen atmosphere, and stirred at 200 rpm. A solution consisting of 37.7 parts of 4HBAGE (manufactured by Mitsubishi Chemical Corporation), 2.0 parts of DPMP (dipentaerythritol hexakis(3-mercaptopropionate), manufactured by SC Organic Chemical Co., Ltd.), 0.35 parts of V-601 (dimethyl azobis(isobutyrate), manufactured by FUJIFILM Wako Pure Chemical Corporation), and 40.0 parts of 1-methoxy-2-propanol was added dropwise thereto for 2 hours, and the mixture was heated and stirred for 2 hours.

Thereafter, 0.10 parts of V-601 was added thereto, and the mixture was heated to 90° C. and allowed to react for 4 hours, thereby obtaining a prepolymer solution.

Subsequently, 8.5 parts of acrylic acid, 0.075 g of 4-hydroxy-2,2,6,6-tetramethylpiperidin-1-oxyl (4OH-TEMPO), 1.9 parts of tetrabutylammonium bromide, 78.0 parts of 1-methoxy-2-propanol were added to the three-neck flask, and the mixture was allowed to react at 90° C. for 24 hours, thereby obtaining a polymer solution.

The weight-average molecular weight of the epoxy polymer E-2 in the polymer solution was 32000, and the concentration of solid contents thereof was 29.4% by mass.

—Synthesis of Particle p-6 (Coating Reaction)—

12.5 parts of the particle solution p-6' and 11.0 parts of ion exchange water were added to a three-neck flask and stirred at 75° C. 4.0 parts of the polymer solution was added dropwise thereto for 15 minutes, and the solution was heated and stirred for 8 hours. The reaction solution was allowed to be naturally cooled to room temperature (25° C.), thereby obtaining a dispersion liquid of particle p-7 (concentration of solid contents: 20% by mass). The average particle diameter of the particle p-7 was 124 nm.

<Synthesis of Particle P-7>

—Synthesis of Pre-Coated Particle p-7'—

Particle p-7' was prepared in the same manner as that for the synthesis of the particle p-3 except that the monomers used were changed as listed in Table 1. The concentration of solid contents of the particle p-7' in the dispersion liquid was 35% by mass, and the average particle diameter of the particle p-7' was 138 nm.

—Synthesis of Particle p-7 (Coating Reaction)—

12.5 parts of the dispersion liquid of the particle p-7', 1.0 part of 4-hydroxybutyl acrylate glycidyl ether (E-1, 4HBAGE, manufactured by Mitsubishi Chemical Corporation), 0.2 parts of tetrabutylammonium bromide, and 30.0 parts of 1-methoxy-2-propanol were added to a three-neck flask, and the mixture was stirred at 90° C. for 12 hours. The reaction solution was allowed to be naturally cooled to room temperature (25° C.), thereby obtaining a dispersion liquid of particle p-7 (concentration of solid contents: 10% by mass). The average particle diameter of the particle p-7 was 139 nm.

<Synthesis of Particle P-8>

Particle p-8 was prepared in the same manner as that for the synthesis of the particle p-6 except that the monomers used were changed as listed in Table 1. The concentration of solid contents of the particle p-8 in the dispersion liquid was 20% by mass, and the average particle diameter of the particle p-8 was 96 nm.

<Synthesis of Particle p-9>

Particle p-9 was prepared in the same manner as that for the synthesis of the particle p-7 except that the monomers used were changed as listed in Table 1. The concentration of solid contents of the particle p-9 in the dispersion liquid was 10% by mass, and the average particle diameter of the particle p-10 was 109 nm.

<Synthesis of Particle p-10'>

Particle p-10' was prepared in the same manner as that for the synthesis of the particle p-6 except that the monomers used were changed as listed in Table 1. The concentration of solid contents of the particle p-10' in the dispersion liquid was 34% by mass, and the average particle diameter of the particle p-10' was 146 nm.

—Synthesis of Amine Polymer E-3—

25 g of a compound (3) shown below, 25 g of a compound (4) shown below, and 70 g of 1-methoxy2-propanol were added to a three-neck flask, stirred in a nitrogen atmosphere, and heated to 80° C. 0.5 g of dimethyl 2,2'-azobisisobutyronitrile was added thereto, and the mixture was allowed to react for 6 hours. 12.7 g of acrylic acid, 2 g of tetrabutylammonium bromide, and 70 g of 1-methoxy-2-propanol were added thereto, and the mixture was allowed to react at 90° C. for 24 hours, thereby obtaining an amine polymer E-3.

The number average molecular weight of the obtained amine polymer E-3 was 36000.

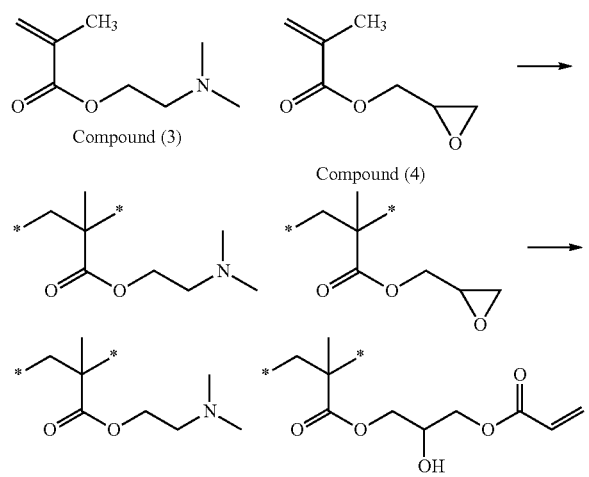

—Synthesis of Particle p-10 (Coating Reaction)—

A dispersion liquid (concentration of solid contents: 19% by mass) of particle p-10 was obtained by carrying out a coating reaction in the same manner as that for the synthesis of the particle p-6 except that the polymer solution containing the hydrogen bond polymer E-3 was used. The average particle diameter of the particle p-10 was 150 nm.

<Synthesis of Particle r-1>

Particle r-1 was prepared in the same manner as that for the synthesis of the particle p-2 except that the monomers used were changed as listed in Table 2.

<Synthesis of Particle r-2>

Particle r-2 was prepared in the same manner as that for the synthesis of the particle p-3 except that the monomers used were changed as listed in Table 2.

<Synthesis of Particle r-3>

10.0 parts of a compound D-1, 85.0 parts of distilled water, and 240.0 parts of n-propanol were added to a four-neck flask, and heated and stirred at 70° C. in a nitrogen atmosphere.

Next, a mixture of 10.0 parts of the compound C-1, 70.0 parts of the compound C-3, and 0.7 parts of 2,2'-azobisisobutyronitrile mixed in advance was added dropwise thereto for 2 hours. After the completion of the dropwise addition, the reaction was allowed to continue for 5 hours, 0.5 part of 2,2'-azobisisobutyronitrile was added to the solution, and the solution was heated to 80° C. 0.4 parts of 2,2'-azobisisobutyronitrile was added thereto every 6 hours, and the solution was allowed to react for a total of 19 hours.

The reaction solution was allowed to be naturally cooled to room temperature (25° C.), thereby obtaining a dispersion liquid of particle r-3 (concentration of solid contents: 23% by mass). The average particle diameter of the particle r-3 was 112 nm.

TABLE 1

| Particle | Unit A Type | Unit A Amount | Unit B Type | Unit B Amount | Unit C Type | Unit C Amount | Unit D Type | Unit D Amount | Surface modification | Average particle diameter (nm) |
|---|---|---|---|---|---|---|---|---|---|---|
| p-1 | A-1 | 10 | B-1 | 10 | C-1/C-3 | 40/30 | D-1 (n = 90) | 10 | — | 103 |
| p-2 | A-2 | 20 | B-2 | 15 | C-3 | 60 | D-2 | 5 | — | 121 |
| p-3 | A-3 | 15 | B-3 | 30 | C-1 | 55 | — | 0 | — | 207 |
| p-4 | A-4 | 30 | B-6 | 20 | C-3 | 40 | D-1 (n = 23) | 10 | — | 163 |
| p-5 | A-5 | 50 | B-4 | 20 | C-2 | 25 | D-2 | 5 | — | 75 |
| p-6 | A-2 | 20 | B-4 | 30 | C-1/C-2 | 30/10 | D-1 (n = 90) | 10 | E2 | 124 |
| p-7 | A-4/A-5 | 30/10 | B-3 | 10 | C-1 | 50 | — | 0 | E1 | 139 |
| p-8 | A-3 | 10 | B-4/B-2 | 30 | C-1/C-3 | 40/15 | D-2 | 5 | E2 | 96 |
| p-9 | A-5 | 60 | B-2 | 5 | C-1 | 35 | — | 0 | E1 | 109 |
| p-10 | A-3 | 5 | B-3 | 30 | C-2/C-3 | 5/45 | D-1 (n = 90) | 15 | E3 | 150 |

TABLE 2

| | Composition of particle | | | | | | | Surface modification | Average particle diameter (nm) |
| --- | --- | --- | --- | --- | --- | --- | --- | --- | --- |
| | Unit A | | Unit B | | Unit C | | Unit D | | |
| Particle | Type | Amount | Type | Amount | Type | Amount | Type | Amount | | |
| r-1 | A-3 | 10 | — | 0 | C-1 | 85 | D-2 | 5 | — | 145 |
| r-2 | — | 0 | B-2 | 20 | C-3 | 80 | — | 0 | — | 139 |
| r-3 | — | 0 | — | 0 | C-2/C-3 | 20/70 | D-1 (n = 45) | 10 | — | 112 |

The details of the abbreviations in Tables 1 and 2 are as follows. Further, the kind of each unit composition is described using monomers, but the corresponding constitutional units (the above-described constitutional units) are used in the resin in the prepared specific particles. Further, the unit of the amount in each unit is parts by mass, which is the amount as a constitutional unit.

Unit A: constitutional unit A having cation moiety

Unit B: constitutional unit B having anion moiety

Unit C: other constitutional units

Unit D: constitutional unit containing hydrophilic group

A-1 to A-5: compounds shown below

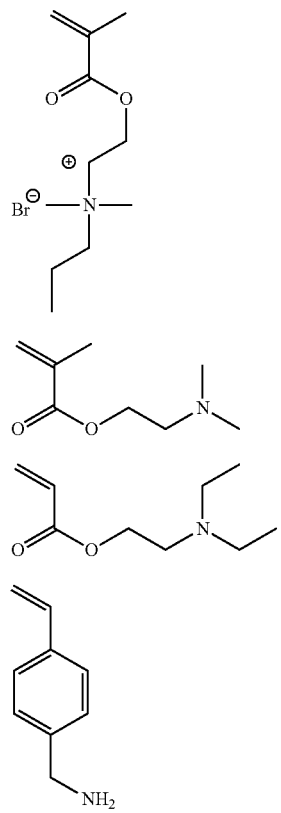

B-1 to B-6: compounds shown below

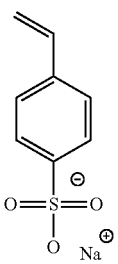
B-1

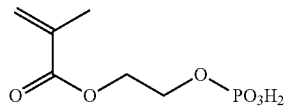
B-2

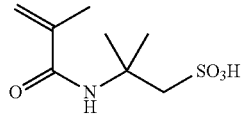
B-3

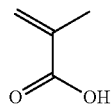
B-4

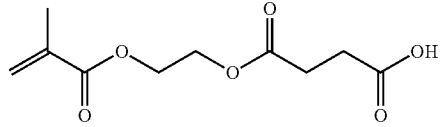
B-5

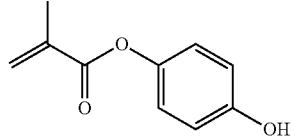
B-6

C-1 to C-3: compounds shown below

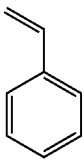
C-1

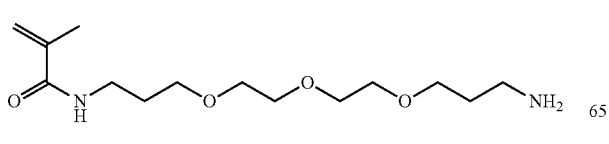

-continued

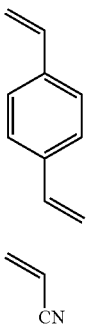

C-2

C-3

D-1 and D-2: compounds shown below (n represents the number listed in Table 1 or Table 2)

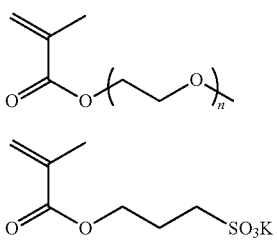

D-1

D-2

<Preparation of Supports A to D>

In order to remove rolling oil on a surface of an aluminum plate (Material JIS A 1050) having a thickness of 0.3 mm, a degreasing treatment was performed using a 10 mass % sodium aluminate aqueous solution at 50° C. for 30 seconds, the surface of the aluminum plate was grained using three bundled nylon brushes having a diameter of 0.3 mm and a pumice water suspension (specific gravity of 1.1 g/cm$^3$) having a median diameter of 25 μm and then sufficiently washed with water. The aluminum plate was etched by being immersed in a 25 mass % sodium hydroxide aqueous solution at 45° C. for 9 seconds, washed with water, further immersed in a 20 mass % nitric acid aqueous solution at 60° C. for 20 seconds, and washed with water. The etching amount of the grained surface was approximately 3 g/m$^2$.

Next, an electrochemical roughening treatment was continuously performed using an AC voltage of 60 Hz. As the electrolytic solution, a 1 mass % nitric acid aqueous solution (including 0.5% by mass of aluminum ions) was used at a liquid temperature of 50° C. Using a trapezoidal rectangular waveform AC having a time TP, until the current value reached a peak from zero, of 0.8 msec and a duty ratio of 1:1 as the AC power source waveform, the electrochemical roughening treatment was performed using a carbon electrode as a counter electrode. As an auxiliary anode, ferrite was used. The current density was 30 A/dm$^2$ in terms of the peak current value, and 5% of the current from the power source was separately flowed to the auxiliary anode. The electric quantity in the nitric acid electrolysis was 175 C/dm$^2$ which is an electric quantity in a case where the aluminum plate was an anode. Thereafter, the aluminum plate was washed with water using a spray.

Next, an electrochemical roughening treatment was performed according to the same method as the method for nitric acid electrolysis under the condition of an electric quantity of 50 C/dm$^2$ in a case where an aluminum plate is an anode in a 0.5 mass % hydrochloric acid aqueous solution (including 0.5% by mass of aluminum ions) and an electrolytic solution at a liquid temperature of 50° C. Subsequently, washing with water using a spray was performed.

Next, 2.5 g/m$^2$ of a DC anodized film was formed on the aluminum plate at a current density of 15 A/dm$^2$ using a 15 mass % sulfuric acid aqueous solution (including 0.5% by mass of aluminum ions) as an electrolytic solution, washed with water, and then dried, thereby preparing a support A. The average pore diameter (surface average pore diameter) in the surface layer of the anodized film was 10 nm.

The pore diameter in the surface layer of the anodized film was measured by observing the surface at a magnification of 150000 times using an ultra-high resolution type SEM (S-900, scanning electron microscope, manufactured by Hitachi, Ltd.) without performing a vapor deposition treatment and the like to impart the conductivity at a relatively low acceleration voltage of 12 V, randomly extracting 50 pores, and acquiring the average value thereof. The standard deviation of errors was ±10% or less.

Thereafter, in order to ensure the hydrophilicity of a non-image area, a silicate treatment was performed on the support A using 2.5% by mass of a No. 3 sodium silicate aqueous solution at 60° C. for 10 seconds, and the support was washed with water, thereby preparing a support B. The adhesion amount of Si was 10 mg/m$^2$. The center line average roughness (Ra) of the support B was measured using a needle having a diameter of 2 μm, and the value was 0.51 μm.

A support C was prepared according to the same method as the method of preparing the support A except that the electrolytic solution in a case of forming a DC anodized film was changed to a 22 mass % phosphoric acid aqueous solution in the preparation of the support C. The average pore diameter (surface average pore diameter) in the surface layer of the anodized film was 25 nm as measured according to the same method as described above.

Thereafter, in order to ensure the hydrophilicity of a non-image area, a silicate treatment was performed on the support C using 2.5% by mass of a No. 3 sodium silicate aqueous solution at 60° C. for 10 seconds, and the support was washed with water, thereby preparing a support D. The adhesion amount of Si was 10 mg/m$^2$. The center line average roughness (Ra) of the support D was measured using a needle having a diameter of 2 μm, and the value was 0.52 μm.

<Preparation of Support E>

An aluminum alloy plate made of the material 1S with a thickness of 0.3 mm was subjected to (A-a) mechanical roughening treatment (brush grain method) described in paragraph 0126 of JP2012-158022A to (A-i) desmutting treatment in an acidic aqueous solution described in paragraph 0134 of JP2012-158022.

Next, an anodized film which had large-diameter pores with an average diameter of 35 nm and a depth of 100 nm and small-diameter pores with an average diameter of 10 nm and a depth of 1000 nm and in which the ratio of the depth of the large-diameter pores to the average diameter of the large-diameter pores was 2.9 was formed by appropriately adjusting conditions for treatments from the first stage anodization treatment (A-j) described in paragraph 0135 of JP2012-158022A to the third stage anodization treatment (A-m) described in paragraph 0138 of JP2012-158022A, thereby obtaining an aluminum support E.

Moreover, during all treatment steps, a water washing treatment was performed, and liquid draining was performed using a nip roller after the water washing treatment.

Example 1 to 13 and Comparative Examples 1 to 4

<Formation of Undercoat Layer>

The support listed in Table 3 was coated with an undercoat layer coating solution (1) having the following composition such that the dry coating amount was set to 20 mg/m², thereby forming an undercoat layer.

Undercoat Layer Coating Solution (1)
Polymer (P-1) [structure shown below]: 0.18 parts
Hydroxyethyliminodiacetic acid: 0.10 parts
Water: 61.4 parts

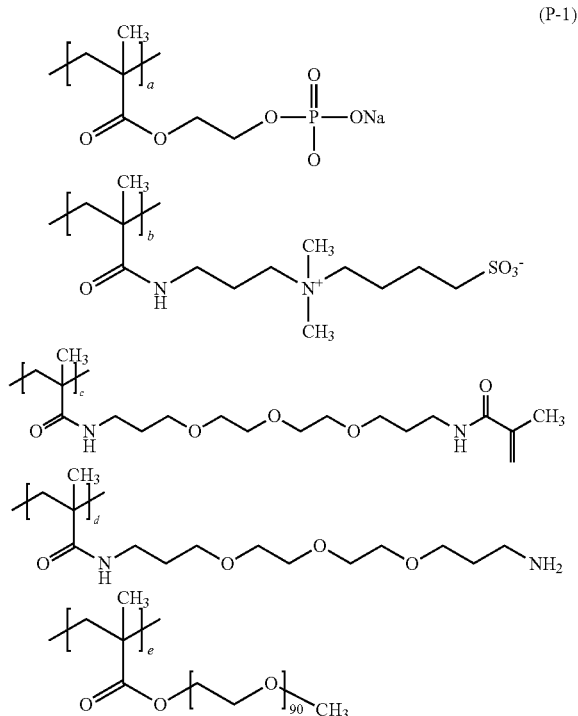

a / b / c / d / e = 14.2 / 71.8 / 8.9 / 0.1 / 5.0 (% by mass)
a / b / c / d / e = 19.0 / 72.8 / 7.7 / 0.1 / 0.4 (mol %)
Weight-average molecular weight = 200000

<Preparation of Planographic Printing Plate Precursor>

The planographic printing plate precursors of Examples 1 to 13 and Comparative Examples 1 to 4 were respectively prepared by the following method.

The undercoat layer was bar-coated with each image recording layer coating solution (concentration of solid contents: 6% by mass) listed in Table 3 and dried in an oven at 1200 for 40 seconds, thereby forming an image recording layer having a dry coating amount of 1.0 g/m².

The image recording layer was bar-coated with the protective layer coating solution having the above-described composition and dried in an oven at 120° C. for 60 seconds, thereby forming a protective layer having a dry coating amount of 0.15 g/m².

In the examples in which the protective layers were formed, "present" is noted in the columns of the protective layers in Table 3.

<Formation of Protective Layer>

The image recording layer was bar-coated with a protective layer coating solution having the following composition and dried in an oven at 120° C. for 60 seconds, thereby forming a protective layer having a dry coating amount of 0.15 g/m².

Protective Layer Coating Solution
Inorganic layered compound dispersion liquid (1) (described below): 1.5 parts
Polyvinyl alcohol (CKS50, manufactured by Nippon Synthetic Chemical Industry Co., Ltd., sulfonic acid-modified, saponification degree of 99% by mole or greater, degree of polymerization of 300), 6 mass % aqueous solution: 0.55 parts
Polyvinyl alcohol (PVA-405, manufactured by Kuraray Co., Ltd., saponification degree of 81.5% by mole, degree of polymerization of 500), 6 mass % aqueous solution: 0.03 parts
Surfactant (EMALEX 710, manufactured by Nihon Emulsion Co., Ltd., polyoxyethylene lauryl ether), 1 mass % aqueous solution): 0.86 parts by mass
Ion exchange water: 6.0 parts The method of preparing the inorganic layered compound dispersion liquid (1) is described below.

<Preparation of Inorganic Layered Compound Dispersion Liquid (1)>

6.4 parts of synthetic mica (SOMASIF ME-100, manufactured by CO-OP CHEMICAL CO., LTD.) was added to 193.6 g of ion exchange water and dispersed such that the average particle diameter (laser scattering method) was set to 3 μm using a homogenizer. The aspect ratio of the obtained dispersed particle was 100 or greater.

<Evaluation of Planographic Printing Plate Precursor>
[UV Printing Durability]

The planographic printing plate precursor prepared in the above-described manner was exposed with Magnus 800 Quantum (manufactured by Kodak Japan Ltd.) equipped with an infrared semiconductor laser under conditions of an output of 27 W, an external drum rotation speed of 450 rpm, and a resolution of 2400 dpi (dot per inch, 1 inch=2.54 cm) (irradiation energy of approximately 110 mJ/cm²). The exposed image was designed to include a solid image and a chart of AM screen (Amplitude Modulated Screening) 3% halftone dots.

The obtained exposed precursor was attached to the cylinder of a printing press SX-74 (manufactured by Heidelberg Co.) having a medium octavo size without being subjected to a development treatment. The present printing press was connected to a dampening water circulation tank having a capacity of 100 L and including a nonwoven fabric filter and a temperature control device. The circulation device was charged with 80 L of dampening water containing 2.0% of dampening water S-Z1 (manufactured by FUJIFILM Corporation), dampening water and ink were supplied using T & K UV OFS K-HS ink GE-M (manufactured by T&K TOKA Co., Ltd.) as printing ink according to a standard automatic printing start method, and printing was performed on Tokubishi Art (manufactured by Mitsubishi Paper Mills Ltd., ream weight of 76.5 kg) paper at a printing speed of 10000 sheets per hour.

As the number of printed sheets increased, the image area was gradually worn, and thus the ink density on the printed material decreased. The number of printed sheets in a case where the value obtained by measuring the halftone dot area ratio of AM screen 3% halftone dots using a Gretag densitometer (manufactured by GretagMacbeth) in the printed material was decreased by 1% than the measured value of the 500th printed sheet was defined as the number of completely printed sheets, and the printing durability was evaluated. The evaluation was performed based on the relative printing durability in which a case where the number of printed sheets was 50000 was rated as 100. The UV printing durability is more excellent as the numerical value increases.

Relative printing durability=(number of printed sheets of target planographic printing plate precursor)/50000×100

[On-Press Developability (Severe Conditions)]

Each planographic printing plate precursor was exposed by Luxel PLATESETTER T-6000III (manufactured by Fujifilm Corporation) equipped with an infrared semiconductor laser under conditions of an external drum rotation speed of 1000 rpm, a laser output of 70%, and a resolution of 2400 dpi. The exposed image had a solid image and a 50% halftone dot chart of a 20 µm dot FM screen.

The exposed planographic printing plate precursor was attached to the plate cylinder of a printing press LITHRONE26 (manufactured by KOMORI Corporation) without performing a development treatment. Dampening water and ink were supplied according to a standard automatic printing start method for LITHRONE26 using dampening water, in which the volume ratio of Ecolity-2 (manufactured by Fujifilm Corporation) to tap water was 1:99, and Values-G (N) black ink (manufactured by DIC Corporation), and then printing was performed on 100 sheets of Tokubishi Art (76.5 kg) (manufactured by Mitsubishi Paper Mills Ltd.) paper at a printing speed of 10000 sheets per hour.

The on-press development performed on the unexposed portion of the image recording layer on the printing press was completed, the number of sheets of printing paper required until the ink was not transferred to the non-image area was measured as the on-press developability, and the evaluation was performed. The on-press developability is excellent as the number of sheets decreases.

※ The dampening water used above consists of Ecolity-2 and tap water at a volume ratio of 2/98, but the on-press development described above was performed using dampening water that is diluted more than the dampening water typically used.

TABLE 3

| | Composition of image recording layer coating solution | | | | | | | | | | | Evaluation result | |
|---|---|---|---|---|---|---|---|---|---|---|---|---|---|
| | Particle (parts) | Polymerization assistant (parts) | Infrared absorbing agent (parts) | Polymerization initiator (parts) | Acid color former (parts) | Polymerizable compound (parts) | Binder polymer (parts) | Sensitizing agent (parts) | Hydrophilic compound (parts) | Solvent (mass ratio) | Type of support | Protective layer | UV printing durability (%) | On-press developability (number of sheets) |
| Example 1 | p-1 (200) | J-1 (45) | K-1 (36) | I-1 (111) | — | M-1/M-3 (24/40) | BI-1 (120) | — | — | S-1/S-2 (20/100) | A | — | 85 | 40 |
| Example 2 | p-2 (300) | J-2 (30) | K-1 (20) | I-1 (99) | — | M-2 (90) | — | CL-2 (15) | T-1 (30) | S-3/S-4/S-1 (40/40/20) | B | Present | 91 | 25 |
| Example 3 | p-3 (180) | J-3 (23) | K-1 (28) | I-1 (42) | — | M-4 (120) | BI-1 (210) | — | T-2 (27) | S-3/S-4 (40/60) | C | — | 88 | 35 |
| Example 4 | p-4 (270) | J-1 (9) | K-2 (41) | I-1 (30) | — | M-2 (180) | — | CL-3 (22) | — | S-3/S-4/S-1 (40/40/20) | D | — | 99 | 36 |
| Example 5 | p-5 (190) | J-5 (15) | K-3 (9) | I-2 (50) | — | M-3 (250) | BI-1 (180) | — | — | S-2/S-5/S-1 (40/10/50) | A | Present | 85 | 45 |
| Example 6 | p-6 (350) | J-1 (28) | K-3 (27) | I-2 (150) | — | M-4/M-5 (190/30) | BI-1 (140) | — | T-3/T-2/T-1 (20/32/10) | S-1/S-2/S-3 (50/30/10) | C | — | 105 | 15 |
| Example 7 | p-7 (240) | J-2/J-1 (25/14) | K-3 (45) | I-2 (75) | H-1 (65) | M-5 (56) | — | CL-1 (20) | — | S-4/S-5 (50/50) | D | — | 100 | 28 |
| Example 8 | p-8 (120) | J-3 (41) | K-1 (20) | I-2 (60) | H-2 (18) | M-3 (210) | — | — | — | S-3/S-4/S-5 (20/40/50) | A | — | 101 | 35 |
| Example 9 | p-9 (450) | J-4 (33) | K-1 (31) | I-3 (41) | H-3 (42) | M-2 (168) | — | — | — | S-1/S-2 (70/30) | E | — | 98 | 46 |
| Example 10 | p-10 (330) | J-5 (38) | K-1 (57) | I-3 (66) | H-4 (50) | M-3 (100) | BI-1 (40) | CL-1/CL-2 (20/6) | — | S-1/S-3/S-4/S-5 (60/20/15/5) | E | Present | 92 | 21 |
| Example 11 | p-7/p-6 (120/120) | — | K-2 (20) | I-2 (60) | — | M-3/M-4/M-5 80/20/90 | — | — | T-3 (70) | S-4/S-5 (50/50) | B | — | 102 | 35 |
| Example 12 | p-6/G-1 (120/120) | J-1 (25) | K-3 (25) | I-3 (95) | — | M-1/M-4 (150/40) | BI-1 (106) | — | T-1/T-2 (10/20) | S-3/S-4/S-5 (70/20/10) | A | — | 110 | 39 |
| Example 13 | P-6/r-3 (120/50) | J-1 (29) | K-1 (41) | I-3 (48) | — | M-2 (120) | BI-1 (123) | — | — | S-1/S-2/S-4/S-5 (80/10/5/5) | C | — | 90 | 44 |
| Comparison example1 | r-1 (220) | — | K-1 (29) | I-3 (35) | — | M-3 (140) | BI-1 (212) | — | — | S-1/S-2/S-3 (25/25/50) | B | — | 35 | 45 |
| Comparison example2 | r-2 (280) | J-1 (35) | K-2 (35) | I-3 (60) | — | M-2/M-3/M-5 (50/60/25) | — | — | T-2 (22) | S-2/S-5 (15/85) | E | — | 45 | 60 |
| Comparison example3 | r-3 (350) | J-1 (28) | K-3 (26) | I-1 (120) | — | M-2 (70/20) | BI-1 (180) | CL-1 (18) | — | S-1/S-3 (90/10) | A | — | 60 | 200↑ |
| Comparison example4 | r-3 (320) | J-1 (50) | K-1 (21) | I-1 (100) | — | M-1/M-5 (160/30) | BI-1 (35) | CL-1 (32) | T-3 (18) | S-1/S-3 (50/50) | C | Present | 65 | 200↑ |

"-" in Table 3 indicates that the corresponding component is not included. Further, "✗" in Table 3 indicates that the solution contains a tetraphenylborate anion derived from K-2 and I-2.

Further, "200 ↑" in the on-press developability of Comparative Example 2 and Comparative Example 3 in Table 3 indicates that the value is greater than 200.

Further, the details of each compound listed in Table 3 other than those described above are described below.

[Infrared Absorbing Agent]

K-1 to K-3: compounds having the following structures

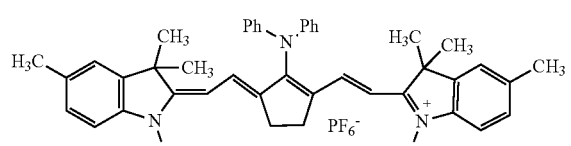

K-1

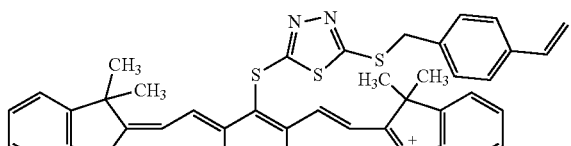

K-2

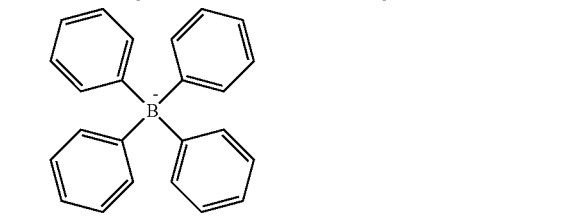

K-3

In the structures shown above, Ph represents a phenyl group.

[Electron-Accepting Polymerization Initiator]

I-1 to I-3: compounds having the following structures

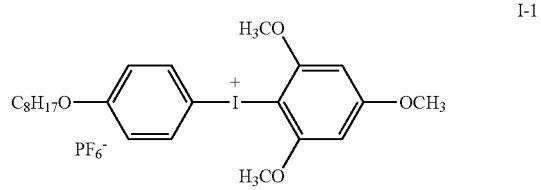

I-1

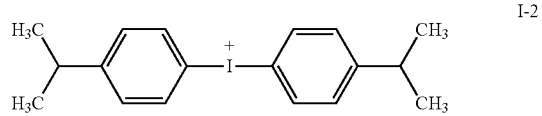

I-2

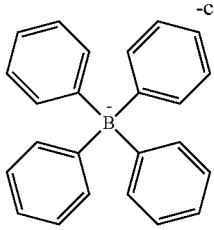

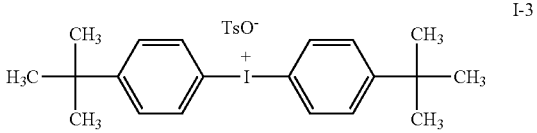

I-3

In the structures shown above, TsO⁻ represents a tosylate anion.

[Electron-Donating Polymerization Initiator (Polymerization Assistant)]

J-1 to J-5: compounds having structures shown below

J-1

Na⊕

Ph—B⊖(Ph)(Ph)—Ph

J-2

Na⊕

Ph—B⊖(Ph)(Ph)—Bu

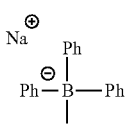

J-3

J-4

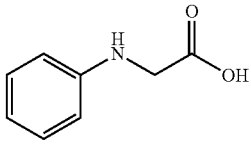

J-5

In the structures shown above, Ph represents a phenyl group, and Bu represents a butyl group.

[Acid Color Former]

H-1: S-205 (manufactured by Fukui Yamada Chemical Co., Ltd.)

H-2: GN-169 (manufactured by Yamamoto Chemicals Inc.)

H-3: Black-XV (manufactured by Yamamoto Chemicals Inc.)

H-4: Red-40 (manufactured by Yamamoto Chemicals Inc.)

[Polymerizable Compound]

M-1: tris(acryloyloxyethyl) isocyanurate, NK ESTER A-9300, manufactured by Shin-Nakamura Chemical Co., Ltd.

M-2: dipentaerythritol pentaacrylate, SR-399, manufactured by Sartomer Japan Inc.

M-3: dipentaerythritol hexaacrylate, A-DPH, manufactured by Shin-Nakamura Chemical Co., Ltd.

M-4: dipentaerythritol pentaacrylate hexamethylene diisocyanate urethane prepolymer, UA-510H, manufactured by Kyoeisha Chemical Co., Ltd.

M-5: ethoxylated pentaerythritol tetraacrylate, ATM-4E, manufactured by Shin-Nakamura Chemical Industry Co., Ltd.

[Binder Polymer]

Binder polymer BI-1 (structure shown below, Mw: 35000, n=2 (number of EO units))

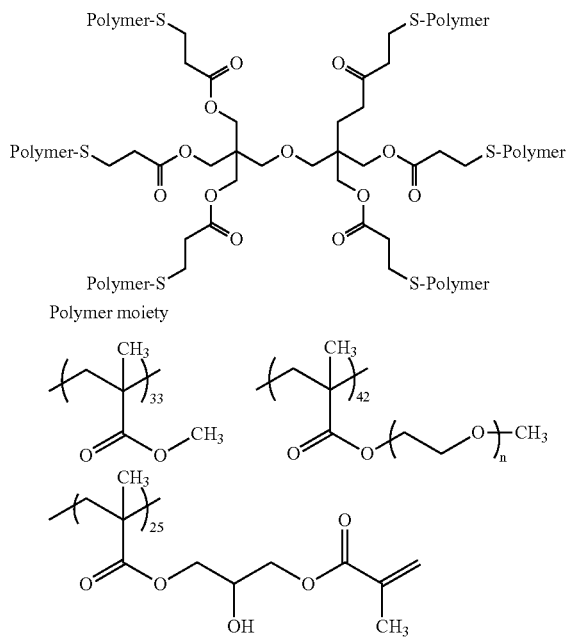

[Polymer Particle]

G-1: An image recording layer coating solution containing a microgel (1) described below and polymer particle G-1 (microgel (1)) was prepared by mixing a composition obtained by mixing the components listed in Table 3 other than the microgel solution with the microgel solution so as to have the composition listed in Table 3 immediately before application and stirring the mixture.

—Preparation of Microgel Solution—

Microgel (1) (polymer particle G-1): 2.640 parts

Distilled water: 2.425 parts

A method of preparing the microgel (1) used in the microgel solution is described below.

—Preparation of Polyvalent Isocyanate Compound (1)—

43 mg of bismuth tris(2-ethylhexanoate) (NEOSTANN U-600, manufactured by NITTO KASEI CO., LTD.) was added to an ethyl acetate (25.31 g) suspension solution of 17.78 g (80 mmol) of isophorone diisocyanate and 7.35 g (20 mmol) of the following polyhydric phenol compound (1), and the resulting solution was stirred. The reaction temperature was set to 50° in a case of heat generation being subsided, and the solution was stirred for 3 hours, thereby obtaining an ethyl acetate (50% by mass) solution of a polyvalent isocyanate compound (1).

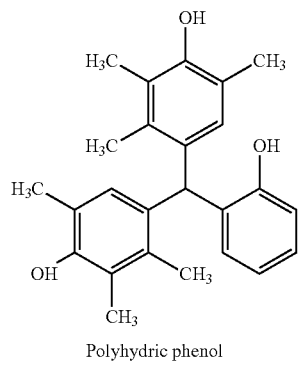

compound (1)

Polyhydric phenol

—Preparation of Microgel (1)—

The oil phase components and the water phase components were mixed with each other and emulsified at 12000 rpm for 10 minutes using a homogenizer. The obtained emulsion was stirred at 45° C. for 4 hours, 5.20 g of a 10 mass % aqueous solution of 1,8-diazabicyclo[5.4.0]undeca-7-ene-octylate (U-CAT SA102, manufactured by San-Apro Ltd.) was added thereto, and the solution was stirred at room temperature for 30 minutes and allowed to stand at 45° C. for 24 hours. The concentration of solid contents was adjusted to 20% by mass using distilled water, thereby obtaining an aqueous dispersion liquid of the microgel (1). The average particle diameter thereof was measured by the light scattering method, and the value was 0.28 μm.

~Oil Phase Component~

(Component 1) ethyl acetate: 12.0 parts (Component 2) adduct (50 mass % ethyl acetate solution, manufactured by Mitsui Chemicals, Inc.) obtained by adding trimethylolpropane (6 molar equivalents) and xylene diisocyanate (18 molar equivalents) and adding methyl one-terminal polyoxyethylene (1 molar equivalent, repetition number of oxyethylene units: 90) thereto: 3.76 parts (Component 3) polyvalent isocyanate compound (1) (as 50 mass % ethyl acetate solution): 15.0 parts (Component 4) 65 mass % solution of dipentaerythritol pentaacrylate (SR-399, manufactured by Sartomer Japan Inc.) in ethyl acetate: 11.54 parts (Component 5) 10% solution of sulfonate type surfactant (PIONINE A-41-C, manufactured by TAKEMOTO OIL & FAT Co., Ltd.) in ethyl acetate: 4.42 parts ~Water Phase Component~

Distilled water: 46.87 parts

[Hydrophilic Compound]

T-1: tris(2-hydroxyethyl) isocyanurate

T-2: compound having the following structure

T-3: hydroxypropyl cellulose, Klucel M, manufactured by Hercules, Inc.

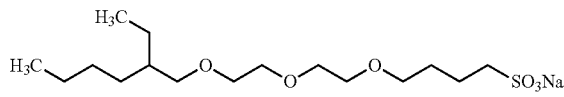

T-2

[Sensitizing Agent]
CL-1: compound having structure shown below
CL-2: benzyl dimethyl octyl ammonium·PF$_6$ salt
CL-3: compound having structure shown below CL-1
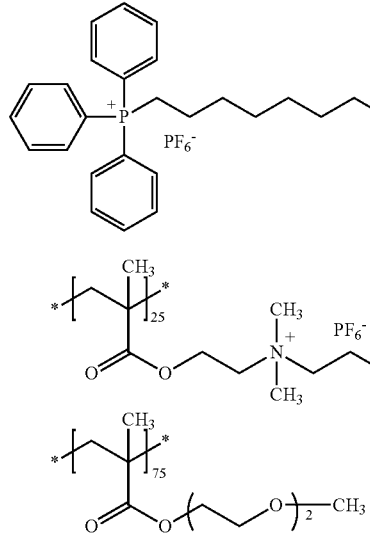

CL-3
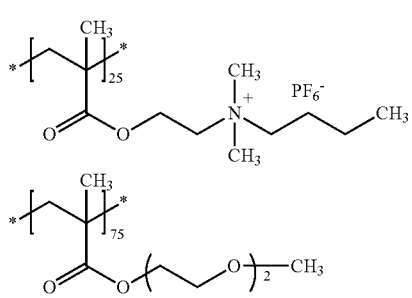

[Solvent]
S-1: 2-butanone (MEK)
S-2: 1-methoxy-2-propanol (MFG)
S-3: methanol
S-4: 1-propanol
S-5: distilled water Based on the results listed in Table 3, it was found that the planographic printing plate precursors according to the embodiment of the present disclosure shown in the examples had excellent UV printing durability compared to the planographic printing plate precursors of the comparative examples.

Further, based on the results listed in Table 3, the planographic printing plate precursors according to the embodiment of the present disclosure shown in the examples also had excellent on-press developability.

The disclosure of JP2019-016541 filed on Jan. 31, 2019 is incorporated herein by reference in its entirety.

All documents, patent applications, and technical standards described in the present specification are incorporated herein by reference to the same extent as in a case of being specifically and individually noted that individual documents, patent applications, and technical standards are incorporated by reference.

What is claimed is:
1. A planographic printing plate precursor comprising:
a support; and
an image recording layer on the support,
wherein the image recording layer contains an organic particle containing a resin that has a constitutional unit A having a cation moiety and a constitutional unit B having an anion moiety,
wherein a monomer forming the constitutional unit A having a cation moiety is an ethylenically unsaturated compound,
wherein the image recording layer is an on-press development type image recording layer, and
wherein the constitutional unit A is selected from the following compounds A-1 to A-5 and the constitutional unit B is selected from the following compounds B-1 to B-6:

A-1
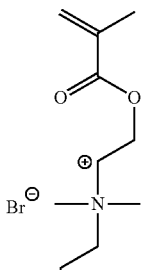

A-2
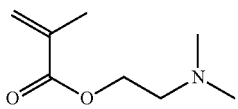

A-3
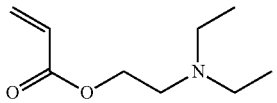

A-4
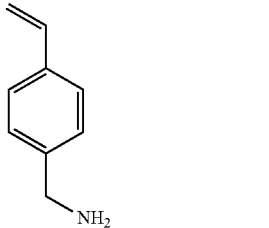

A-5
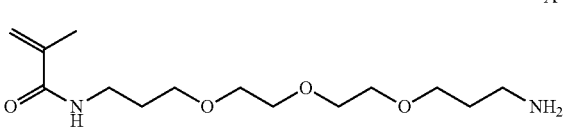

B-1
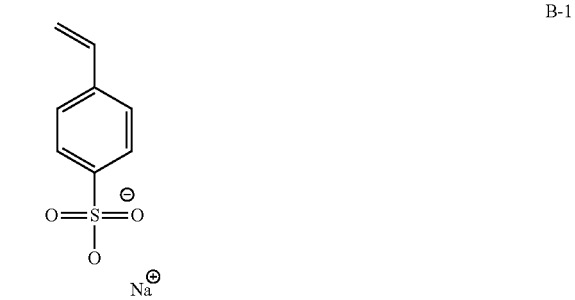

B-2
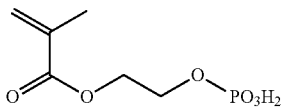

B-3
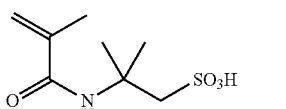

B-4
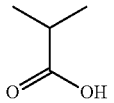

-continued

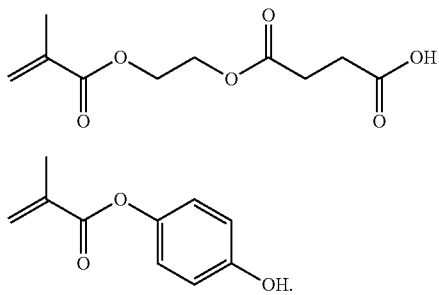

2. The planographic printing plate precursor according to claim 1,
wherein a total content of the constitutional unit A and the constitutional unit B in the resin contained in the organic particle is greater than 5% by mass with respect to a total mass of the resin.

3. The planographic printing plate precursor according to claim 1,
wherein the resin contained in the organic particle includes an addition polymerization type resin.

4. The planographic printing plate precursor according to claim 1,
wherein the total content of the constitutional unit A and the constitutional unit B in the resin is greater than 20% by mass with respect to the total mass of the resin, and a content of the constitutional unit A is 10% by mass or greater with respect to the total content of the resin.

5. The planographic printing plate precursor according to claim 1,
wherein the resin further has a constitutional unit containing a hydrophilic group.

6. The planographic printing plate precursor according to claim 5,
wherein the hydrophilic group is a group represented by Formula Z, -Q-W-Y        Formula Z in Formula Z, Q represents a divalent linking group, W represents a divalent group having a hydrophilic structure or a divalent group having a hydrophobic structure, and Y represents a monovalent group having a hydrophilic structure or a monovalent group having a hydrophobic structure, where any of W and Y has a hydrophilic structure.

7. The planographic printing plate precursor according to claim 5,
wherein the hydrophilic group includes a group having a polyalkylene oxide structure.

8. The planographic printing plate precursor according to claim 5,
wherein the hydrophilic group includes a sulfonate group or a sulfonic acid group.

9. The planographic printing plate precursor according to claim 1,
wherein a content of the constitutional unit containing the hydrophilic group in the resin is 1% by mass or greater and less than 20% by mass with respect to the total mass of the resin.

10. The planographic printing plate precursor according to claim 1,
wherein the organic particle includes an organic particle having an ethylenically unsaturated group on the surface thereof.

11. The planographic printing plate precursor according to claim 1,
wherein the image recording layer further contains an infrared absorbing agent.

12. The planographic printing plate precursor according to claim 1,
wherein the image recording layer further contains a polymerization initiator and a polymerizable compound.

13. The planographic printing plate precursor according to claim 1,
wherein the image recording layer further contains a binder polymer.

14. The planographic printing plate precursor according to claim 1, further comprising:
a protective layer on the image recording layer.

15. The planographic printing plate precursor to claim 14,
wherein the protective layer contains an inorganic layered compound.

16. The planographic printing plate precursor according to claim 1,
wherein the image recording layer is a negative type image recording layer.

17. A method of preparing a planographic printing plate comprising:
imagewise-exposing the planographic printing plate precursor according to claim 1; and
supplying at least one selected from the group consisting of printing ink and dampening water to remove an image recording layer of a non-image area on a printing press.

18. A planographic printing method comprising:
imagewise-exposing the planographic printing plate precursor according to claim 1;
supplying at least one selected from the group consisting of printing ink and dampening water to remove an image recording layer of a non-image area on a printing press and preparing a planographic printing plate; and
performing printing using the obtained planographic printing plate.

19. A planographic printing plate precursor comprising:
a support; and
an image recording layer on the support,
wherein the image recording layer contains an organic particle containing a resin that has a constitutional unit A having a cation moiety and a constitutional unit B having an anion moiety,
wherein the organic particle includes an organic particle having an ethylenically unsaturated group on the surface thereof,
wherein the image recording layer is an on-press development type image recording layer, and
wherein the constitutional unit A is selected from the following compounds A-1 to A-5 and the constitutional unit B is selected from the following compounds B-1 to B-6:

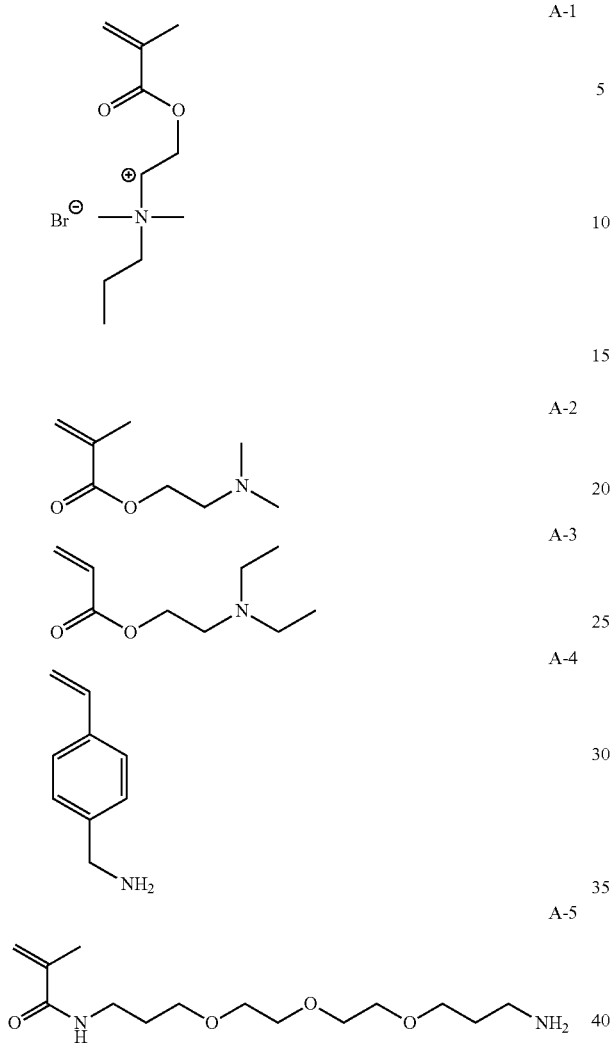
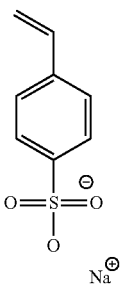
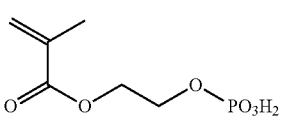
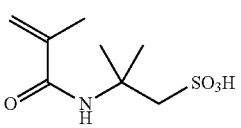
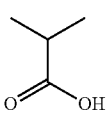
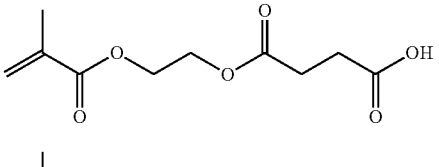
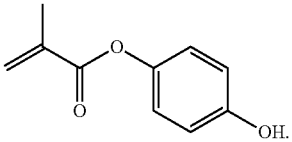
* * * * *